US012563870B2

(12) United States Patent (10) Patent No.: US 12,563,870 B2
Hwang et al. (45) Date of Patent: Feb. 24, 2026

(54) MICRO LIGHT EMITTING DEVICE AND DISPLAY APPARATUS INCLUDING THE SAME

(71) Applicant: SAMSUNG ELECTRONICS CO., LTD., Suwon-si (KR)

(72) Inventors: Junsik Hwang, Hwaseong-si (KR); Kyungwook Hwang, Seoul (KR); Seogwoo Hong, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 732 days.

(21) Appl. No.: 17/729,769

(22) Filed: Apr. 26, 2022

(65) Prior Publication Data

US 2023/0133466 A1 May 4, 2023

(30) Foreign Application Priority Data

Oct. 28, 2021 (KR) ........................ 10-2021-0145860

(51) Int. Cl.
H10H 20/831 (2025.01)
H10H 20/821 (2025.01)
(Continued)

(52) U.S. Cl.
CPC ...... H10H 20/8312 (2025.01); H10H 20/821 (2025.01); H10H 20/825 (2025.01);
(Continued)

(58) Field of Classification Search
CPC .... H10H 20/00; H10H 20/011; H10H 20/012; H10H 20/013; H10H 20/01335;
(Continued)

(56) References Cited

U.S. PATENT DOCUMENTS

2005/0211989 A1* 9/2005 Horio ................... H10H 20/832
257/E33.068
2012/0025252 A1* 2/2012 Ichizono .......... H10H 20/01335
257/E33.025
(Continued)

FOREIGN PATENT DOCUMENTS

CN 106505132 A 3/2017
CN 107251240 A 10/2017
(Continued)

OTHER PUBLICATIONS

Communication issued Oct. 24, 2022 by the European Patent Office for European Patent Application No. 22173044.3.
(Continued)

*Primary Examiner* — Brook Kebede
(74) *Attorney, Agent, or Firm* — Sughrue Mion, PLLC

(57) ABSTRACT

A micro light emitting device includes a first semiconductor layer doped with a first conductivity type, a light emitting layer arranged on an upper surface of the first semiconductor layer, a second semiconductor layer arranged on an upper surface of the light emitting layer and doped with a second conductivity type electrically opposite to the first conductivity type, an insulating layer arranged on an upper surface of the second semiconductor layer, a first electrode arranged on an upper surface of the insulating layer and electrically connected to the first semiconductor layer, a second electrode arranged on the upper surface of the insulating layer and electrically connected to the second semiconductor layer, and an aluminum nitride layer arranged on a lower surface of the first semiconductor layer and having a flat surface.

21 Claims, 20 Drawing Sheets

(51) Int. Cl.

| | |
|---|---|
| *H10H 20/825* | (2025.01) |
| *H10H 20/851* | (2025.01) |
| *H10H 20/857* | (2025.01) |
| *H10H 29/14* | (2025.01) |

(52) U.S. Cl.
CPC ...... *H10H 20/8514* (2025.01); *H10H 20/857* (2025.01); *H10H 29/142* (2025.01)

(58) Field of Classification Search
CPC ............. H10H 20/0137; H10H 20/014; H10H 20/821; H10H 20/825; H10H 20/8312; H10H 20/8514; H10H 20/857; H10H 29/00; H10H 29/011; H10H 29/032; H10H 29/142
See application file for complete search history.

(56) References Cited

U.S. PATENT DOCUMENTS

| | | | |
|---|---|---|---|
| 2015/0228846 A1 | 8/2015 | Ohmae et al. | |
| 2017/0069794 A1 | 3/2017 | Kim | |
| 2018/0040767 A1 | 2/2018 | Jang et al. | |
| 2020/0135975 A1* | 4/2020 | Abe ...................... | B65D 83/53 |
| 2020/0251451 A1 | 8/2020 | Schuele et al. | |
| 2021/0082887 A1 | 3/2021 | Jang et al. | |
| 2022/0013400 A1 | 1/2022 | Hwang et al. | |
| 2022/0077120 A1 | 3/2022 | Hong et al. | |
| 2022/0077346 A1 | 3/2022 | Hwang et al. | |
| 2022/0102602 A1 | 3/2022 | Hwang et al. | |
| 2022/0115359 A1 | 4/2022 | Kim et al. | |
| 2022/0122953 A1 | 4/2022 | Hwang et al. | |
| 2022/0131032 A1* | 4/2022 | Tseng ................. | H10H 20/8162 |
| 2022/0139887 A1 | 5/2022 | Kim et al. | |

FOREIGN PATENT DOCUMENTS

| | | |
|---|---|---|
| CN | 110112090 A | 8/2019 |
| CN | 111477726 A | 7/2020 |
| CN | 112234123 A | 1/2021 |
| CN | 112670380 A | 4/2021 |
| JP | 2007-116097 A | 5/2007 |
| KR | 1999-0055282 A | 7/1999 |
| KR | 10-2017-0028082 A | 3/2017 |
| KR | 10-2021-0088002 A | 7/2021 |
| KR | 10-2022-0007500 A | 1/2022 |
| KR | 10-2022-0013739 A | 2/2022 |
| KR | 10-2022-0031364 A | 3/2022 |
| KR | 10-2022-0032917 A | 3/2022 |
| KR | 10-2022-0041484 A | 4/2022 |
| KR | 10-2022-0047131 A | 4/2022 |
| KR | 10-2022-0050674 A | 4/2022 |
| KR | 10-2022-0060977 A | 5/2022 |

OTHER PUBLICATIONS

Communication dated Aug. 1, 2024, issued by the Korean Intellectual Property Office in Korean Patent Application No. 10-2021-0145860.
Communication dated Aug. 2, 2025, issued by the China National Intellectual Property Administration in Chinese Application No. 202210812814.X.

* cited by examiner 105
104
103
102
101

MICRO LIGHT EMITTING DEVICE AND DISPLAY APPARATUS INCLUDING THE SAME

CROSS-REFERENCE TO RELATED APPLICATION

This application is based on and claims priority under 35 U.S.C. § 119 to Korean Patent Application No. 10-2021-0145860, filed on Oct. 28, 2021, in the Korean Intellectual Property Office, the disclosure of which is incorporated by reference herein in its entirety.

BACKGROUND

1. Field

The disclosure relates to a micro light emitting device and a display apparatus including the same, and more particularly, to a micro light emitting device having a structure suitable for alignment in a fluidic self assembly method and a display apparatus including the same.

2. Description of Related Art

Light emitting diodes (LEDs) have increased industrial demand because of their advantages of low power consumption and eco-friendliness, and are used in lighting devices or Liquid Crystal Display (LCD) backlights, and also applied as pixels of display apparatuses. Recently, a micro LED display apparatus using a micro-unit LED chip as a pixel has been developed. In manufacturing a display apparatus using a micro-unit LED chip, a laser lift off or pick and place method is used as a method of transferring the micro LED. However, in this method, as the size of the micro LED decreases and the size of the display apparatus increases, productivity is lowered.

SUMMARY

A micro light emitting device having a structure suitable for alignment in a fluidic self assembly method is provided.

A display apparatus that may be manufactured by a fluidic self-assembly method is provided.

Additional aspects will be set forth in part in the description which follows and, in part, will be apparent from the description, or may be learned by practice of embodiments of the disclosure.

In accordance with an aspect of the disclosure, a micro light emitting device includes a first semiconductor layer doped with a first impurity having a first conductivity; a light emitting layer arranged on an upper surface of the first semiconductor layer; a second semiconductor layer arranged on an upper surface of the light emitting layer, the second semiconductor layer being doped with a second impurity having a second conductivity electrically opposite to the first conductivity; an insulating layer arranged on an upper surface of the second semiconductor layer; a first electrode arranged on an upper surface of the insulating layer and electrically connected to the first semiconductor layer; a second electrode arranged on the upper surface of the insulating layer and electrically connected to the second semiconductor layer; and an aluminum nitride layer arranged on a lower surface of the first semiconductor layer, the aluminum nitride layer comprising a flat surface.

A width of the micro light emitting device may be in a range of about 1 μm to about 100 μm.

A width of the first semiconductor layer may be greater than a thickness of the micro light emitting device.

The thickness of the micro light emitting device may be in a range of about 2 μm to about 10 μm, and the width of the first semiconductor layer may be in a range of about 5 μm to about 50 μm.

A width of the second semiconductor layer may be greater than the thickness of the micro light emitting device.

A side surface of the micro light emitting device may be inclined such that the width of the first semiconductor layer is greater than the width of the second semiconductor layer.

A surface roughness of a surface of the aluminum nitride layer may be about 50 nm or less.

The surface roughness of the surface of the aluminum nitride layer may be about 10 nm or less.

The micro light emitting device may further include an irregular light scattering structure distributed inside the first semiconductor layer.

The aluminum nitride layer may include a plurality of isolated grooves.

Each of the plurality of isolated grooves may have a dot shape, and the plurality of isolated grooves may be two-dimensionally arranged in a surface of the aluminum nitride layer.

Each the plurality of isolated grooves may have a ring shape, and the plurality of isolated grooves may be arranged concentrically in a surface of the aluminum nitride layer.

The second electrode may be arranged at a position corresponding to a center of the second semiconductor layer in a horizontal direction, and the first electrode may be arranged at a position corresponding to an edge of the second semiconductor layer in the horizontal direction.

The first electrode may have a symmetrical shape surrounding the second electrode.

The micro light emitting device may further include a via hole passing through the second semiconductor layer and the light emitting layer, wherein the insulating layer extends to surround a sidewall of the via hole, and the first electrode is configured to contact the first semiconductor layer through the via hole, and the second electrode may be configured to penetrate the insulating layer and contact the second semiconductor layer.

The micro light emitting device may further include a bonding spread prevention wall arranged between the first electrode and the second electrode.

The bonding spread prevention wall may have a protruding shape on the upper surface of the insulating layer.

The bonding spread prevention wall may have a shape of a groove.

The micro light emitting device may have a rectangular cross-section viewed in a vertical direction, and the first electrode may be arranged in two vertex regions facing each other in a diagonal direction.

The micro light emitting device may further include a bonding pad arranged in each of two other vertex regions different from the two vertex regions, the two other vertex regions facing each other in another diagonal direction different from the diagonal direction.

In accordance with an aspect of the disclosure, a display apparatus includes a display substrate; and a plurality of micro light emitting devices arranged on the display substrate, wherein at least one of the plurality of micro light emitting devices includes a first semiconductor layer doped with a first impurity having a first conductivity; a light emitting layer arranged on an upper surface of the first semiconductor layer; a second semiconductor layer arranged on an upper surface of the light emitting layer, the second semiconductor layer being doped with a second impurity having a second conductivity electrically opposite to the first conductivity; an insulating layer arranged on an upper surface of the second semiconductor layer; a first electrode arranged on an upper surface of the insulating layer and electrically connected to the first semiconductor layer; a second electrode arranged on the upper surface of the insulating layer and electrically connected to the second semiconductor layer; and an aluminum nitride layer arranged on a lower surface of the first semiconductor layer, the aluminum nitride layer comprising a flat surface.

The display apparatus may further include a wavelength conversion layer configured to convert a wavelength of light emitted from the plurality of micro light emitting devices.

The wavelength conversion layer may include a first wavelength conversion layer configured to convert the light emitted from the plurality of micro light emitting devices into light of a first wavelength band, and a second wavelength conversion layer configured to convert the light emitted from the plurality of micro light emitting devices into light of a second wavelength band different from the first wavelength band.

The display apparatus may further include a color filter layer including a first filter arranged to face the first wavelength conversion layer and configured to transmit the light of the first wavelength band; and a second filter arranged to face the second wavelength conversion layer and configured to transmit the light of the second wavelength band.

In accordance with an aspect of the disclosure, a micro light emitting device includes a first electrode on a first surface of the micro light emitting device; and an aluminum nitride layer on a second surface of the micro light emitting device opposite to the first surface, wherein a surface roughness of the aluminum nitride layer is 50 nm or less.

A first shape of the first electrode may be radially symmetrical with respect to a center of the micro light emitting device.

The micro light emitting device may further include a second electrode on the first surface, wherein a second shape of the second electrode is radially symmetrical with respect to the center of the micro light emitting device.

In accordance with an aspect of the disclosure, a micro light emitting device includes a first semiconductor layer doped with a first impurity having a first conductivity; a light emitting layer arranged on an upper surface of the first semiconductor layer; a second semiconductor layer arranged on an upper surface of the light emitting layer, the second semiconductor layer being doped with a second impurity having a second conductivity electrically opposite to the first conductivity; an insulating layer arranged on an upper surface of the second semiconductor layer; a first electrode arranged on an upper surface of the insulating layer and electrically connected to the first semiconductor layer; a second electrode arranged on the upper surface of the insulating layer and electrically connected to the second semiconductor layer; a bonding spread prevention wall arranged between the first electrode and the second electrode; a bonding pad arranged on the upper surface of the insulating layer; and an aluminum nitride layer arranged on a lower surface of the first semiconductor layer, the aluminum nitride layer comprising a flat surface.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 6 is a cross-sectional view showing a schematic structure of a transfer substrate according to an embodiment in which micro light emitting devices are arranged;

FIG. 11 is a cross-sectional view schematically showing the structure of a micro light emitting device according to an embodiment;

DETAILED DESCRIPTION

Figure 1:
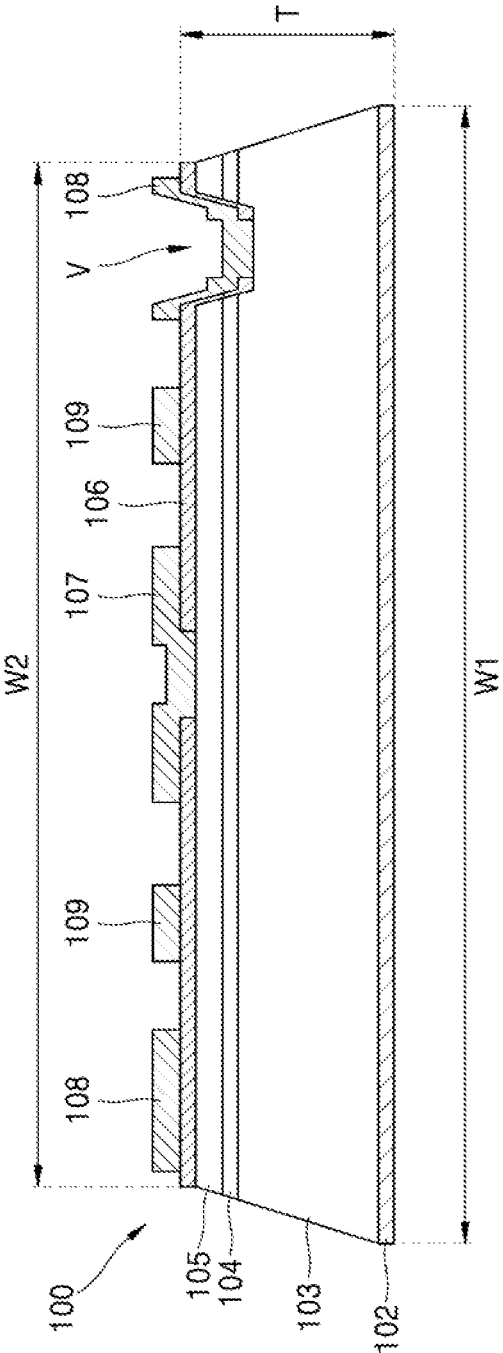
FIG. 1 is a cross-sectional view schematically showing a structure of a micro light emitting device according to an embodiment.

Reference will now be made in detail to embodiments, examples of which are illustrated in the accompanying drawings, wherein like reference numerals refer to like elements throughout. In this regard, embodiments may have different forms and should not be construed as being limited to the descriptions set forth herein. Accordingly, embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, a micro light emitting device and a display apparatus including the same will be described in detail with reference to the accompanying drawings. In the following drawings, the same reference numerals refer to the same components, and the size of each component in the drawings may be exaggerated for clarity and convenience of description. Further, embodiments described below are merely examples, and various modifications are possible from these embodiments.

Hereinafter, what is described as "upper part" or "on" may include not only those directly above by contact, but also those above non-contact. The terms of a singular form may include plural forms unless otherwise specified. In addition, when a certain part "includes" a certain component, it means that other components may be further included rather than excluding other components unless otherwise stated.

The use of the term "the" and similar designating terms may correspond to both the singular and the plural. If there is no explicit order or contradictory statement about the steps constituting the method, these steps may be performed in an appropriate order, and are not necessarily limited to the order described.

In addition, terms such as "unit" and "module" described in the specification mean a unit that processes at least one function or operation, and this may be implemented as hardware or software, or may be implemented as a combination of hardware and software.

The connection or connection members of lines between the components shown in the drawings are illustrative of functional connections and/or physical or circuit connections, and may be represented as a variety of functional connections, physical connections, or circuit connections that are replaceable or additional in an actual device.

The use of all examples or illustrative terms is merely for describing technical ideas in detail, and the scope is not limited by these examples or illustrative terms unless limited by the claims.

FIG. 1 is a cross-sectional view schematically showing the structure of a micro light emitting device according to an embodiment. Referring to FIG. 1, a micro light emitting device 100 may include a first semiconductor layer 103, a light emitting layer 104 arranged on the upper surface of the first semiconductor layer 103, a second semiconductor layer 105 arranged on the upper surface of the light emitting layer 104, an insulating layer 106 arranged on the upper surface of the second semiconductor layer 105, a first electrode 108 arranged on the upper surface of the insulating layer 106 such that the first electrode 108 is electrically connected to the first semiconductor layer 103, a second electrode 107 arranged on the upper surface of the insulating layer 106 such that the second electrode 107 is electrically connected to the second semiconductor layer 105, and an aluminum nitride (AlN) layer 102 arranged on the lower surface of the first semiconductor layer 103 and having a flat surface. The first electrode 108 and the second electrode 107 may be arranged on an upper surface (e.g., a first surface) of the micro light emitting device 100. The AlN layer 102 may be arranged on a lower surface (e.g., a second surface) of the micro light emitting device 100.

The first semiconductor layer 103 and the second semiconductor layer 105 may include, for example, a group III-V or group II-VI compound semiconductor. The first semiconductor layer 103 and the second semiconductor layer 105 may provide electrons and holes to the light emitting layer 104. For this, the first semiconductor layer 103 and the second semiconductor layer 105 may be electrically doped with opposite types. For example, the first semiconductor layer 103 may be doped with an n-type impurity (e.g., a first impurity having a first conductivity) and the second semiconductor layer 105 may be doped with a p-type impurity (e.g., a second impurity having a second conductivity), or the first semiconductor layer 103 may be doped p-type and the second semiconductor layer 105 may be doped n-type.

The light emitting layer 104 has a quantum well structure in which quantum wells are arranged between barriers. Light may be generated as electrons and holes provided from the first and second semiconductor layers 103 and 105 recombine in the quantum well in the light emitting layer 104. The wavelength of light generated from the light emitting layer 104 may be determined according to the energy band gap of the material forming the quantum well in the light emitting layer 104. The light emitting layer 104 may have only one quantum well, or may have a multi-quantum well (MQW) structure in which a plurality of quantum wells are alternately arranged with a plurality of barriers. The thickness of the light emitting layer 104 or the number of quantum wells in the light emitting layer 104 may be appropriately selected considering the driving voltage and luminous efficiency of the light emitting device.

To easily align the micro light emitting device 100 in a fluidic self assembly method to be described below, both the first electrode 108 and the second electrode 107 may be arranged on one surface of the micro light emitting device 100. For example, with reference to FIG. 1, the insulating layer 106 may be formed on the upper surface of the second semiconductor layer 105, and both of the first electrode 108 and the second electrode 107 may be arranged on the upper surface of the insulating layer 106. To electrically connect the first electrode 108 to the first semiconductor layer 103, the micro light emitting device 100 may further include a via hole V passing through the second semiconductor layer 105 and the light emitting layer 104. The insulating layer 106 may extend to surround the sidewall of the via hole V. In other words, a portion of the second semiconductor layer 105 exposed by the via hole V and a portion of the light emitting layer 104 exposed by the via hole V may be covered by the insulating layer 106. The first electrode 108 extends from the upper surface of the insulating layer 106 to the upper surface of the first semiconductor layer 103 exposed through the via hole V to contact the first semiconductor layer 103 through the via hole V. The second electrode 107 may be configured to penetrate the insulating layer 106 and contact the second semiconductor layer 105. Also, a portion of the second electrode 107 may further extend laterally from the upper surface of the insulating layer 106.

The AlN layer 102 may provide a flat lower surface to easily align the micro light emitting device 100 in a fluidic self assembly method. For this, the AlN layer 102 may have a very smooth and flat lower surface. For example, the root mean square (RMS) of the surface roughness of the lower surface of the AlN layer 102 may be about 50 nm or less, or about 10 nm or less.

In addition, to easily align the micro light emitting device 100 in a fluidic self assembly method, the micro light emitting device 100 may have a shape in which the diameter or width of the micro light emitting device 100 is greater than the thickness of the micro light emitting device 100. In particular, the diameter or width W1 of the first semiconductor layer 103 may be greater than the thickness T of the micro light emitting device 100. For example, the thickness T of the micro light emitting device 100 may be less than about 20 μm, for example, in the range of about 1 μm to about 20 μm, or in the range of about 2 μm to about 10 μm and, the diameter or width W1 of the first semiconductor layer 103 may be less than about 100 μm, for example, in the range of about 1 μm to about 100 μm, or in the range of about 5 μm to about 50 μm. For example, the diameter or width W1 of the first semiconductor layer 103 may be greater than the thickness T, or greater than two times, or five times the thickness T of the micro light emitting device 100. Here, the size, that is, the diameter or width of the micro light emitting device 100, may be defined as the diameter or width W1 of the widest portion of the first semiconductor layer 103. Accordingly, the size, that is, the diameter or width of the micro light emitting device 100, may be, for example, in the range of about 1 μm to about 100 μm, or in the range of about 5 μm to about 50 μm.

According to an embodiment, the micro light emitting device 100 may have an inclined side surface such that the diameter or width W1 of both of the AlN layer 102 and the first semiconductor layer 103 is greater than the diameter or width W2 of the second semiconductor layer 105 and the insulating layer 106. For example, the diameter or width W2 of the second semiconductor layer 105 may be 0.7 times or more of the diameter or width W1 and less than the diameter or width W1, or 0.8 times or more of the diameter or width W1 and 0.95 times or less of the diameter or width W1 of the first semiconductor layer 103. Accordingly, the areas of both of the AlN layer 102 and the first semiconductor layer 103 may be larger than those of the second semiconductor layer 105 and the insulating layer 106. In addition, the diameter or width W2 of the second semiconductor layer 105 of the micro light emitting device 100 may also be greater than the thickness T of the micro light emitting device 100.

In addition, the micro light emitting device 100 may further include a bonding spread prevention wall 109 arranged between the first electrode 108 and the second electrode 107 on the upper surface of the insulating layer 106. When bonding the first electrode 108 and the second electrode 107 of the micro light emitting device 100 to the corresponding electrode pads on the display substrate of the display apparatus in the process of manufacturing the display apparatus, for example, the bonding spread prevention wall 109 prevents a bonding material such as a solder bump from spreading between the first electrode 108 and the second electrode 107 to prevent a short circuit. The bonding spread prevention wall 109 may have a shape protruding above the upper surface of the insulating layer 106. The thickness of the bonding spread prevention wall 109 may be less than or equal to the thickness of the first and second electrodes 108 and 107. In addition, the bonding spread prevention wall 109 may be made of an electrically insulating material.

Figure 2A:
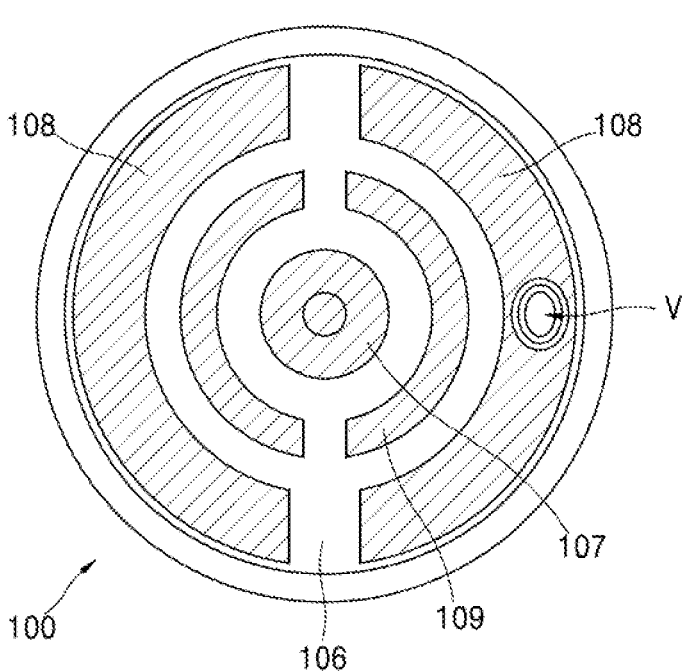
FIGS. 2A to 2C are plan views illustrating various electrode structures of a micro light emitting device according to embodiments.
Figure 2B:
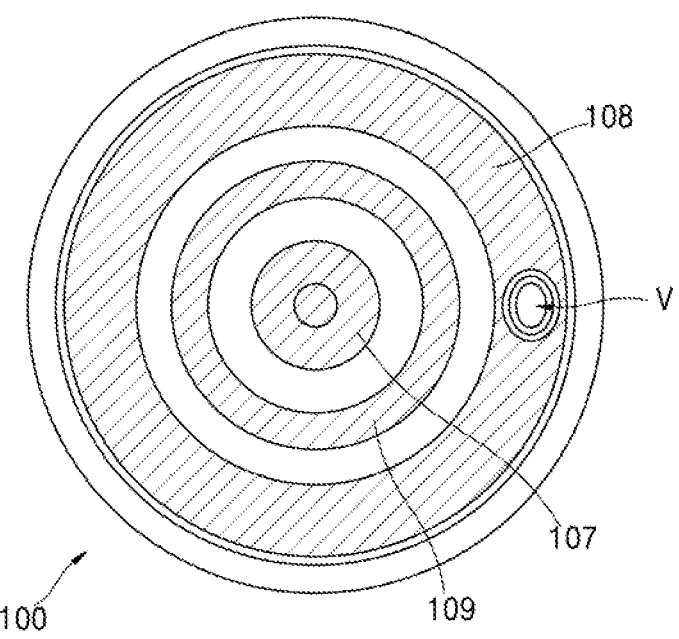
Figure 2C:
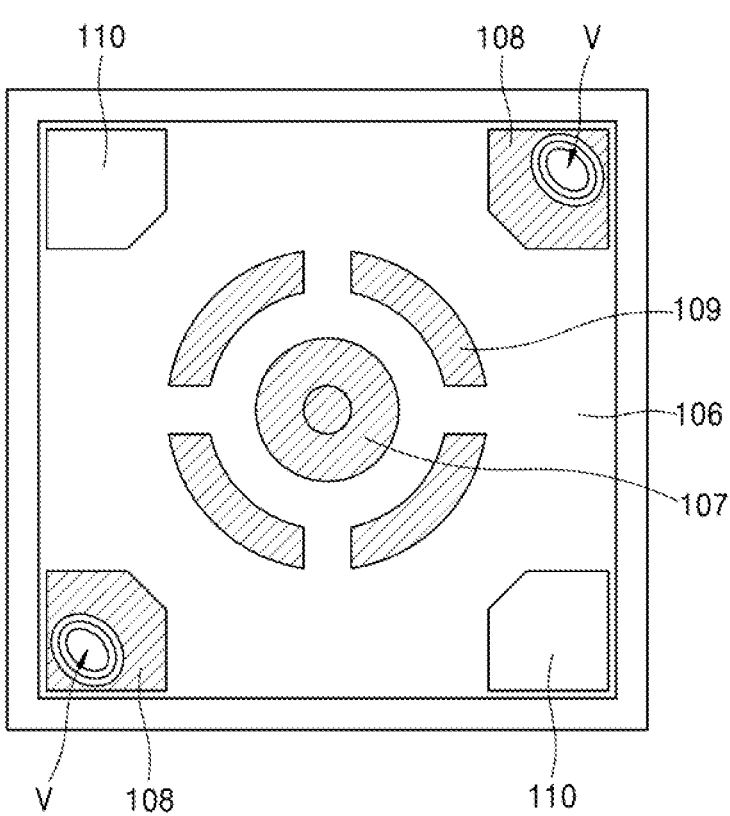

To easily bond the first electrode 108 and the second electrode 107 of the micro light emitting device 100 to the corresponding electrode pads on the display substrate in the process of manufacturing the display apparatus, the first electrode 108 and the second electrode 107 may have a symmetrical shape. In other words, for example, the first electrode 108 and the second electrode 107 may have a first shape and a second shape, respectively, that each have radial symmetry with respect to a center of the micro light emitting device 100. FIGS. 2A to 2C are plan views illustrating various electrode structures of the micro light emitting device 100.

Referring to FIG. 2A, a horizontal cross-section of the micro light emitting device 100 (e.g., a cross-section when viewed in a vertical direction) may have a circular shape. The second electrode 107 may be arranged at the center of the second semiconductor layer 105, that is, a position corresponding to the center of the micro light emitting device 100 in the horizontal direction (e.g., the width direction). The second electrode 107 may have a circular shape. However, the disclosure is not necessarily limited thereto, and the second electrode 107 may have a quadrangle or another polygonal shape. The first electrode 108 may be arranged at an edge of the micro light emitting device 100, that is, a position corresponding to the edge of the second semiconductor layer 105 in the horizontal direction. The first electrode 108 may have a symmetrical shape surrounding the second electrode 107. For example, the first electrode 108 may have the form of two separated semicircular rings surrounding the second electrode 107. In FIG. 2A, the first electrode 108 is illustrated as having the shape of two separated rings as an example, but the disclosure is not limited thereto. The first electrode 108 may have, for example, the shape of three or more separated rings. Even if the first electrodes 108 have separated portions, they may be electrically connected to each other when they are bonded to the electrode pads on the display substrate.

In addition, the bonding spread prevention wall 109 may be arranged in the form of a ring between the first electrode 108 and the second electrode 107. The bonding spread prevention wall 109 may have the shape of two or more separated rings like the first electrode 108, and may be arranged to completely block a path between the first electrode 108 and the second electrode 107.

Referring to FIG. 2B, each of the first electrode 108 and the bonding spread prevention wall 109 may have the form of one complete ring.

Referring to FIG. 2C, a cross-section of the micro light emitting device 100 may have a rectangular shape. The second electrode 107 is arranged at the center of the micro light emitting device 100 and may have a circular or polygonal shape. The first electrode 108 may be respectively arranged in two vertex regions of the rectangular shape facing each other in a diagonal direction. In addition, the micro light emitting device 100 may further include bonding pads 110 respectively arranged at two different vertex regions facing each other in different diagonal directions. In other words, the bonding pads 110 may be arranged at the two other vertex regions of the rectangular shape that face each other in another diagonal direction of the rectangular shape. When the first electrode 108 and the second electrode 107 of the micro light emitting device 100 are bonded to the electrode pad on the display substrate, the bonding pad 110 is bonded to the display substrate so that the micro light emitting device 100 may be stably mounted on the display substrate. Alternatively, the first electrode 108 may be arranged in all four vertex regions without the bonding pad 110.

FIGS. 3A to 3D are cross-sectional views schematically illustrating a process of manufacturing the micro light emitting device 100 shown in FIG. 1.

Figure 3A:
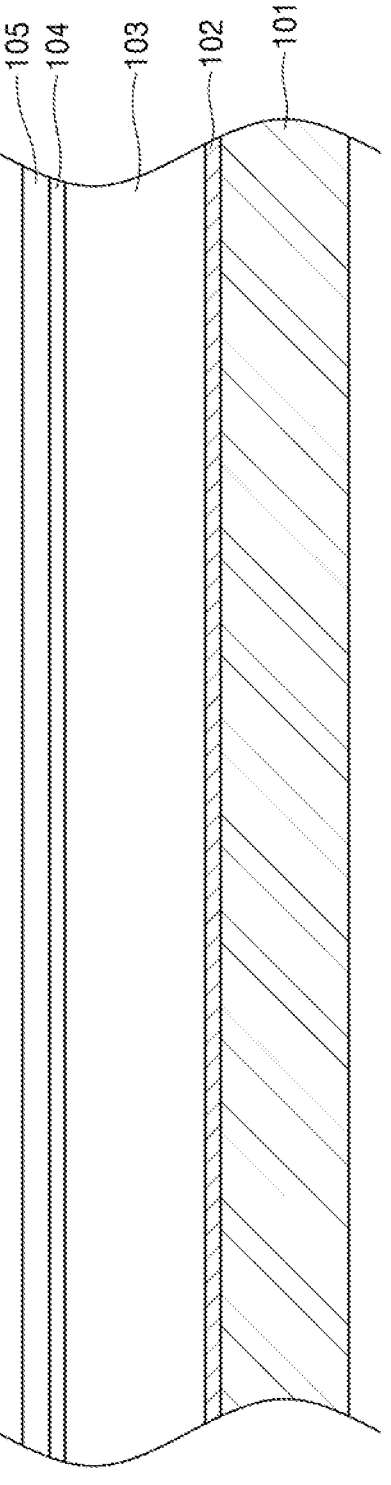
FIGS. 3A to 3D are cross-sectional views schematically illustrating a process of manufacturing the micro light emitting device shown in FIG. 1.

Referring to FIG. 3A, the AlN layer 102, the first semiconductor layer 103, the light emitting layer 104, and the second semiconductor layer 105 may be sequentially grown on a growth substrate 101. The growth substrate 101 may be, for example, a silicon substrate. The AlN layer 102 may serve as a buffer layer used to grow a compound semiconductor on a silicon substrate.

Figure 3B:
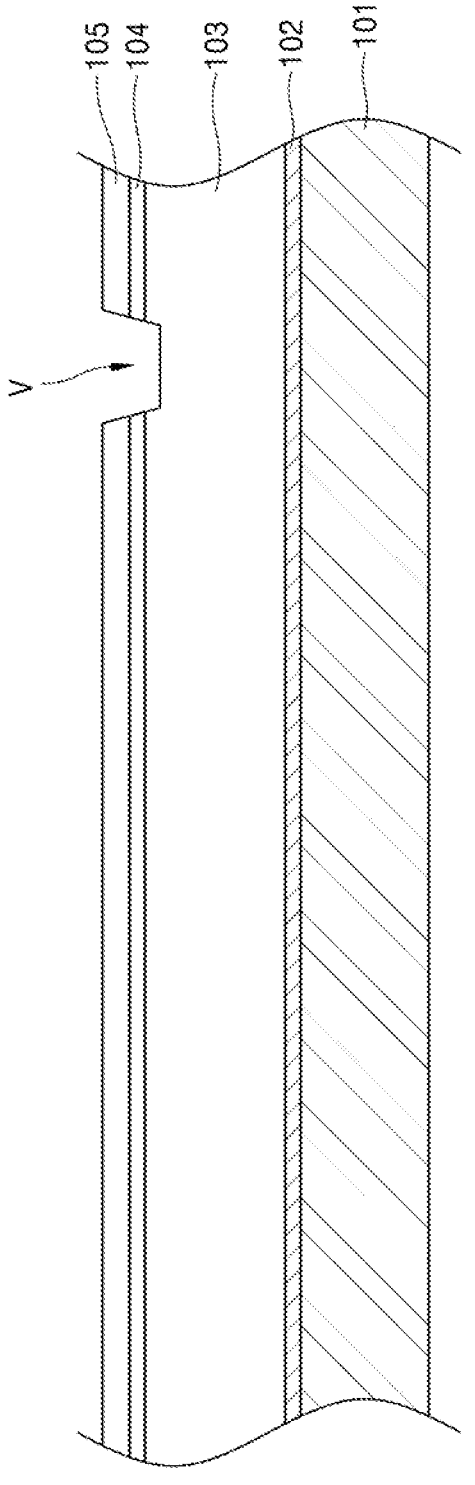

Referring to FIG. 3B, the first semiconductor layer 103 may be exposed by partially etching the second semiconductor layer 105 and the light emitting layer 104 to form a via hole V.

Figure 3C:
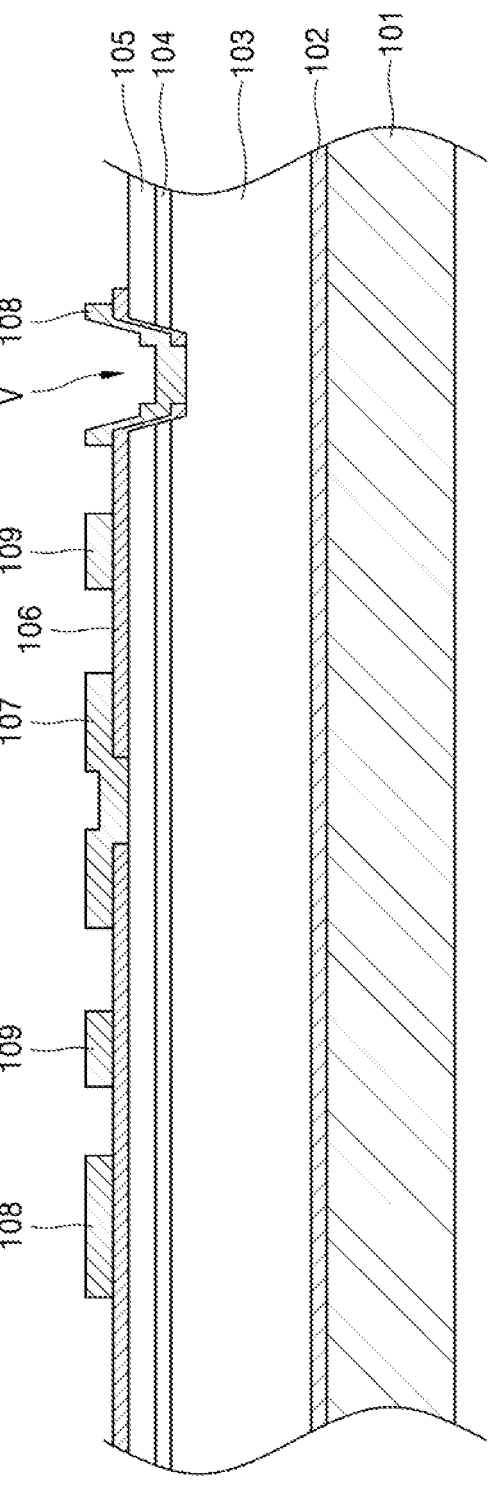

Referring to FIG. 3C, an insulating layer 106 may be formed on the second semiconductor layer 105. The insulating layer 106 extends to the inner sidewall of the via hole V so that a portion of the second semiconductor layer 105 exposed by the via hole V and a portion of the light emitting layer 104 exposed by the via hole V may be covered by the insulating layer 106. Then, the first electrode 108 and the second electrode 107 may be formed to be in contact with the first semiconductor layer 103 and the second semiconductor layer 105, respectively, and a bonding spread prevention wall 109 may be formed between the first electrode 108 and the second electrode 107.

Figure 3D:
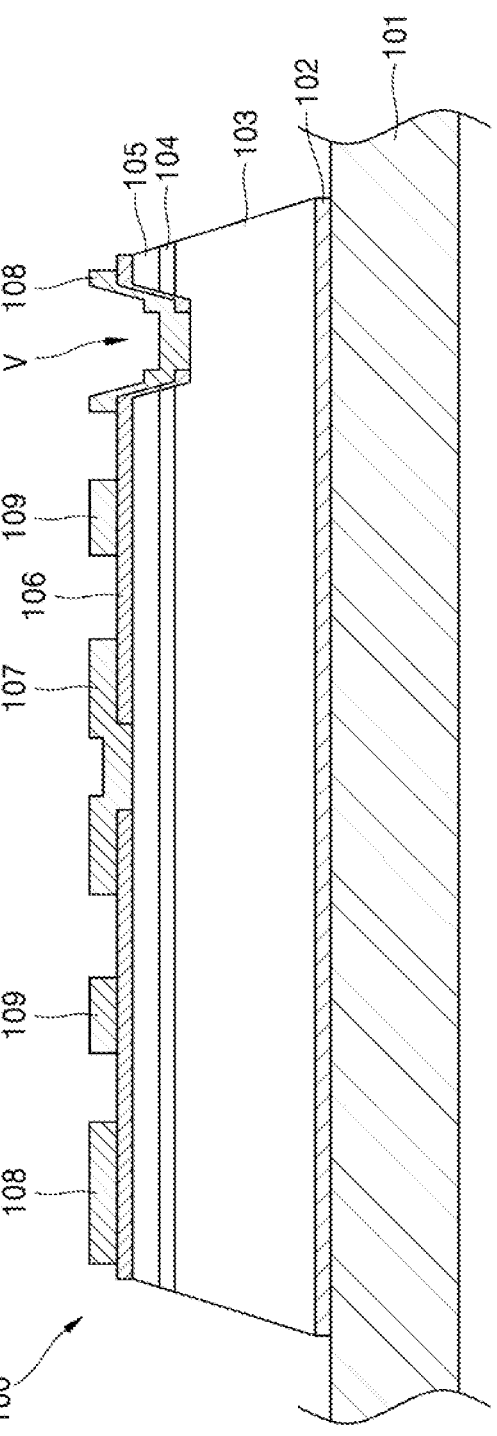

Referring to FIG. 3D, the insulating layer 106, the second semiconductor layer 105, the light emitting layer 104, the first semiconductor layer 103, and the AlN layer 102 are partially etched to form a plurality of micro light emitting devices 100. Although one micro light emitting device 100 is illustrated in FIG. 3D for convenience, a large number of micro light emitting devices 100 may be formed on one growth substrate 101.

Thereafter, the micro light emitting device 100 may be separated from the growth substrate 101 through a chemical lift off method. When the micro light emitting device 100 is separated through chemical lift off, the lower surface of the micro light emitting device 100, that is, the lower surface of the AlN layer 102, may be very smooth.

Figure 4:
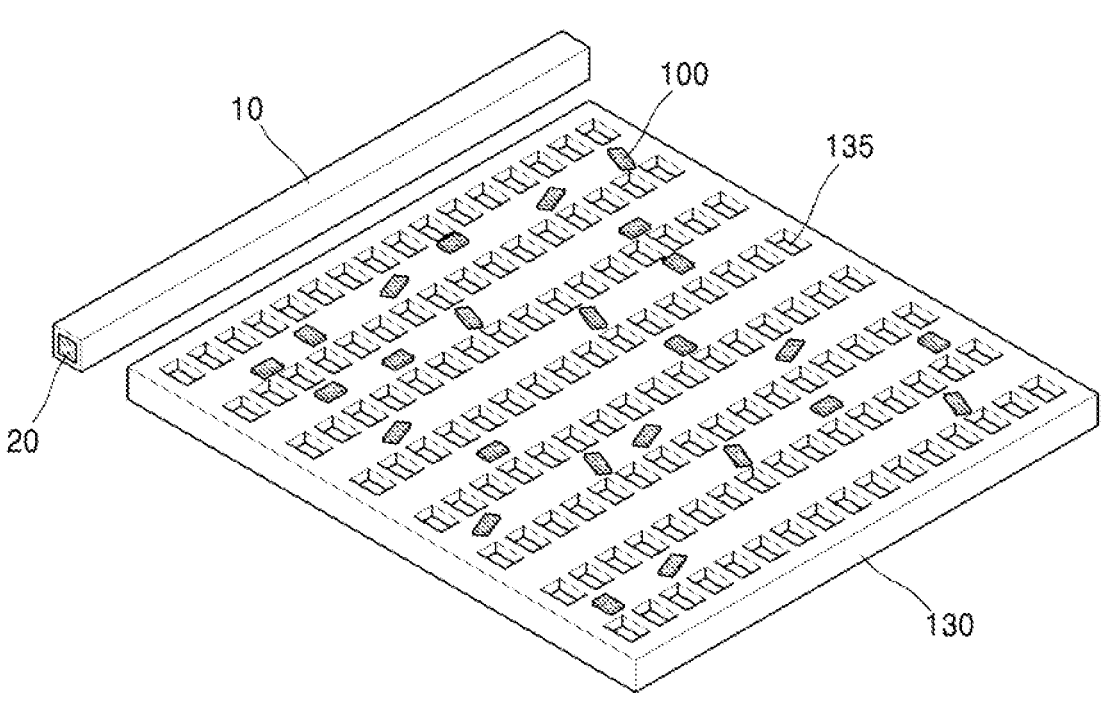
FIG. 4 is a perspective view showing an example method of aligning a micro light emitting device using a fluidic self assembly method according to an embodiment.

Before being mounted on the display substrate of the display apparatus, the micro light emitting device 100 formed in such a way may first be aligned on a separate transfer substrate using a fluidic self assembly method. FIG. 4 is a perspective view showing an example method of aligning the micro light emitting device 100 using a fluidic self assembly method.

Referring to FIG. 4, a plurality of micro light emitting devices 100 may be supplied on the upper surface of a transfer substrate 130 having grooves 135 that are two dimensionally arranged. The plurality of micro light emitting devices 100 may be directly sprayed on the transfer substrate 130 after supplying the liquid to the grooves 135 of the transfer substrate 130 or supplied on the transfer substrate 130 in a state included in a suspension.

The liquid supplied to the grooves 135 may be any kind of liquid as long as the liquid does not corrode or damage the micro light emitting device 100, and may be supplied to the grooves 135 by various methods, such as a spray method, a dispensing method, an inkjet dot method, a method for flowing a liquid to the transfer substrate 130, and the like. The liquid may include, for example, any one or more from among water, ethanol, alcohol, polyol, ketone, halocarbon, acetone, flux, and organic solvent. The organic solvent may include, for example, isopropyl alcohol (IPA). The amount of liquid supplied may be varied to fit or overflow from the grooves 135.

The plurality of micro light emitting devices 100 may be directly sprayed on the transfer substrate 130 without another liquid, or may be supplied on the transfer substrate 130 in a state included in a suspension. As a supply method of the micro light emitting device 100 included in the suspension, a spray method, a dispensing method for dropping a liquid, an inkjet dot method for discharging a liquid like a printing method, a method for flowing a suspension to the transfer substrate 130, and the like may be used in various ways.

Figure 5:
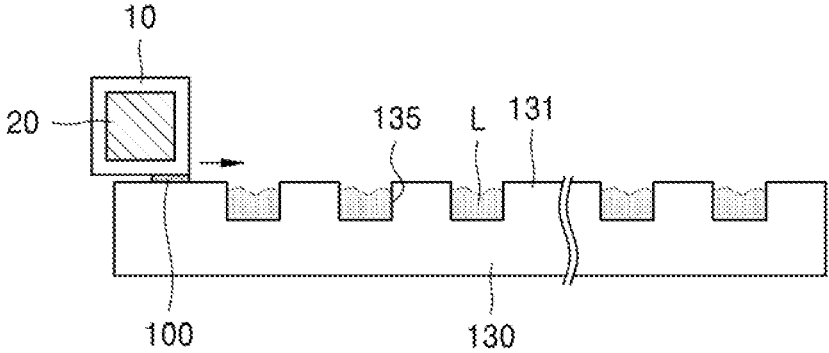
FIG. 5 schematically shows a scanning process for aligning a micro light emitting device according to an embodiment.

FIG. 5 schematically shows a scanning process for aligning the micro light emitting device 100. Referring to FIG. 5, an absorber 10 may scan the transfer substrate 130. While passing through the plurality of grooves 135 and while in contact with the transfer substrate 130 according to the scanning, the absorber 10 may move the micro light emitting devices 100 into the grooves 135, and may also absorb the liquid L in the grooves 135. The absorber 10 is sufficient as long as the absorber 10 is a material that may absorb the liquid L, and its shape or structure is not limited. The absorber 10 may include, for example, fabric, tissue, polyester fiber, paper, or a wiper.

The absorber 10 may be used alone without other auxiliary devices, but is not limited thereto, and may be coupled to a support 20 for convenient scanning of the transfer substrate 130. The support 20 may have various shapes and structures suitable for scanning the transfer substrate 130. For example, the support 20 may have the form of a rod, a blade, a plate, a wiper, or the like. The absorber 10 may be provided on either side of the support 20 or wrap around the support 20. The shape of the support 20 and the absorber 10 is not limited to the illustrated rectangular cross-sectional shape, and may have a circular or other cross-sectional shape.

The absorber 10 may be scanned while pressing the transfer substrate 130 with an appropriate pressure. Because a partition wall 131 of the transfer substrate 130 includes a flexible polymer material, even if pressure is applied to the transfer substrate 130, the original thickness of the partition wall 131 may be restored after scanning. Scanning may be performed in various methods, for example, a sliding method, a rotating method, a translating motion method, a reciprocating motion method, a rolling method, a spinning method, and/or a rubbing method of the absorber 10, and may include both a regular manner and an irregular manner. Scanning may be performed by moving the transfer substrate 130 instead of moving the absorber 10, and scanning of the transfer substrate 130 may also be performed in a manner such as a sliding, rotating, translational reciprocating, rolling, spinning, and/or rubbing method. In addition, scanning may be performed by the cooperation of the absorber 10 and the transfer substrate 130.

The operation of supplying the liquid L to the grooves 135 of the transfer substrate 130 and the operation of supplying the micro light emitting devices 100 to the transfer substrate 130 may be performed in the reverse order to the order described above. In addition, the operation of supplying the liquid L to the grooves 135 of the transfer substrate 130 and the operation of supplying the micro light emitting devices 100 to the transfer substrate 130 may be simultaneously performed in one operation. For example, by supplying a suspension including the micro light emitting devices 100 to the transfer substrate 130, the liquid L and the micro light emitting devices 100 may be simultaneously supplied to the transfer substrate 130. After the absorber 10 scans the transfer substrate 130, the micro light emitting devices 100 remaining in the transfer substrate 130 without entering the grooves 135 may be removed. The processes described above may be repeated until the micro light emitting devices 100 are seated in all the grooves 135. As described above, a large number of micro light emitting devices 100 may be aligned on a large-area transfer substrate 130 using a fluidic self assembly method.

Figure 6:
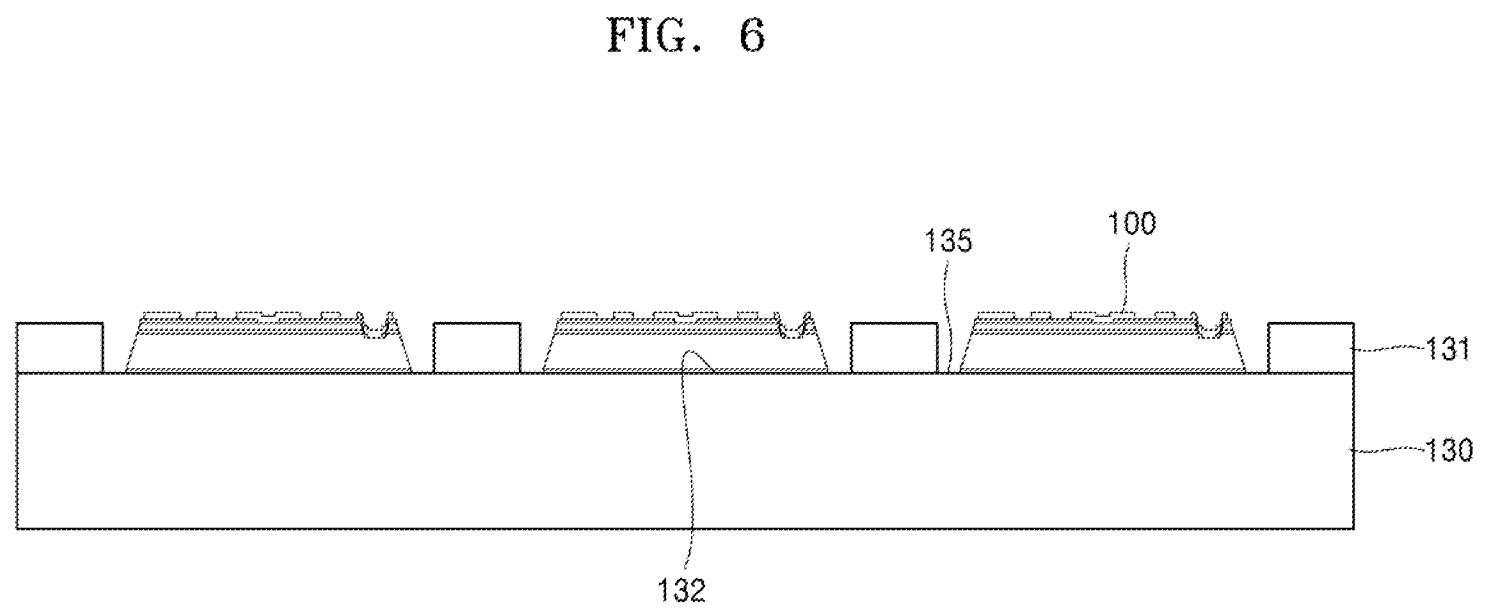

FIG. 6 is a cross-sectional view showing a schematic structure of a transfer substrate 130 according to an embodiment in which the micro light emitting devices 100 are arranged. Referring to FIG. 6, the transfer substrate 130 may include the partition wall 131 arranged on the upper surface of the transfer substrate 130 and having a plurality of grooves 135. The partition wall 131 may be made of a flexible polymer material. For example, the partition wall 131 may include at least one of an acrylic polymer, a silicone-based polymer, and an epoxy-based polymer. In addition, the partition wall 131 may further include a photosensitive material. When the partition wall 131 includes a photosensitive material, a plurality of grooves 135 may be formed by a photolithography method. When the partition wall 131 does not include a photosensitive material, the plurality of grooves 135 may be formed by etching and molding. The thickness (e.g., the height) of the partition wall 131 may be slightly greater than or slightly less than the thickness of the micro light emitting device 100. For example, the thickness of the partition wall 131 may be 0.8 to 1.2 times the thickness of the micro light emitting device 100.

Using the fluidic self assembly method described above, one micro light emitting device 100 may be arranged in each groove 135. In this case, the partition wall 131 may surround the micro light emitting device 100. The micro light emitting device 100 may be disposed such that the first and second electrodes 108 and 107 face up, that is, out of the groove 135, and the AlN layer 102 contacts the bottom surface 132 of the groove 135. For this, the bottom surface 132 of the groove 135 that comes into contact with the lower surface of the micro light emitting device 100 may be made of a dielectric material having high hydrophilicity and a very smooth surface. For example, the RMS surface roughness of the bottom surface 132 of the groove 135 may be about 50 nm or less, or about 10 nm or less. In addition, the AlN layer 102 in contact with the bottom surface 132 of the groove 135 may also have hydrophilicity and an RMS surface roughness of about 50 nm or less, or about 10 nm or less.

Therefore, when the AlN layer 102 comes into contact with the bottom surface 132 of the groove 135 during the fluidic self assembly process, due to the high surface energy, the micro light emitting device 100 settles in the groove 135 without exiting the groove 135. In addition, due to the structure of the micro light emitting device 100 having a larger diameter or width than the thickness, when the AlN layer 102 comes into contact with the bottom surface 132 of the groove 135, the contact area is relatively large, so that surface energy may be further increased. In addition, in the structure of the micro light emitting device 100 having an inclined side surface, because the area of the AlN layer 102 is larger than the area of the insulating layer 106, when the AlN layer 102 contacts the bottom surface 132 of the groove 135, the surface energy may further increase.

On the other hand, when the first and second electrodes 107 and 108 contact the bottom surface 132 of the groove 135 within the groove 135, because the surface energy is low, the micro light emitting device 100 may easily come out of the groove 135 even with a weak force. Therefore, when aligning the micro light emitting device 100 using the fluidic self assembly method, the first and second electrodes 107 and 108 may face the outside of the groove 135 when the micro light emitting device 100 is fixed in the groove 135. In addition, the first and second electrodes 107 and 108 may allow the micro light emitting device 100 that is not fixed in the groove 135 and remains on the partition wall 131 to be easily separated from the transfer substrate 130 in the cleaning operation. In this regard, the disclosed micro light emitting device 100 may have a structure suitable for alignment in a fluidic self assembly method. Although not shown in the drawing, a concave-convex pattern may be further formed on the upper surface of the partition wall 131 so that the micro light emitting device 100 may be more easily separated from the partition wall 131.

Figure 7:
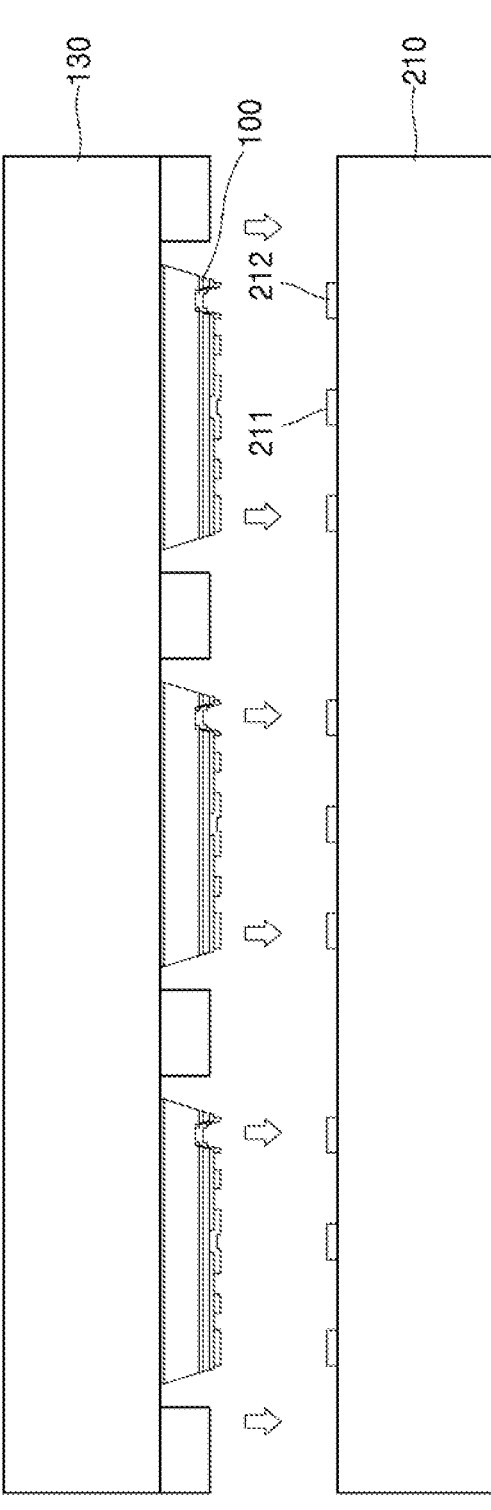
FIG. 7 is a cross-sectional view schematically illustrating a process of transferring a micro light emitting device aligned on a transfer substrate onto a display substrate according to an embodiment.

A plurality of micro light emitting devices 100 aligned on the transfer substrate 130 may be transferred onto a display substrate of the display apparatus for manufacturing the display apparatus. FIG. 7 is a cross-sectional view schematically showing a process of transferring the micro light emitting device 100 aligned on the transfer substrate 130 onto the display substrate.

Referring to FIG. 7, a display substrate 210 may include a plurality of first electrode pads 211 and a plurality of second electrode pads 212. The display substrate 210 may further include a driving circuit including a plurality of thin film transistors for independently controlling the plurality of micro light emitting devices 100. For example, a plurality of thin film transistors are arranged under the first electrode pad 211 and the second electrode pad 212 in the display substrate 210, and the plurality of thin film transistors may be electrically connected to the first and second electrode pads 211 and 212 through wiring.

The transfer substrate 130 may be arranged such that the first and second electrodes 108 and 107 of the micro light emitting device 100 face the display substrate 210. Then, the transfer substrate 130 may be pressed onto the display substrate 210 such that the first electrode 108 of the micro light emitting device 100 is in contact with the first electrode pad 211 of the display substrate 210, and the second electrode 107 is in contact with the second electrode pad 212 of the display substrate 210. Then, the first electrode 108 may be bonded to the first electrode pad 211 and the second electrode 107 may be bonded to the second electrode pad 212 through a bonding material such as solder bumps. In this way, when the micro light emitting device 100 is completely fixed to the display substrate 210, the transfer substrate 130 may be detached from the micro light emitting device 100. As described above, by using the micro light emitting device 100 having a structure suitable for alignment in the fluidic self-assembly method, a large-area display apparatus may be relatively easily manufactured by the fluidic self-assembly method.

Figure 8:
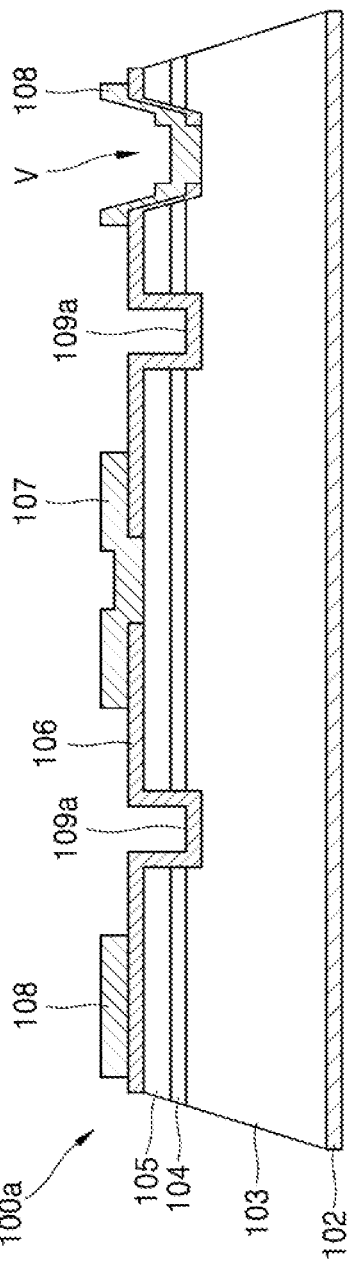
FIG. 8 is a cross-sectional view schematically illustrating a structure of a micro light emitting device according to an embodiment.

FIG. 8 is a cross-sectional view schematically illustrating a structure of a micro light emitting device according to an embodiment. In FIG. 1, the bonding spread prevention wall 109 has been described as having an embossed structure protruding above the insulating layer 106, but the disclosure is not limited thereto. Referring to FIG. 8, a micro light emitting device 100a may include a bonding spread prevention wall 109a having an engraved structure, for example, a concave groove. For example, a trench may be formed by etching a portion of the second semiconductor layer 105 and a portion of the light emitting layer 104 at the position of the bonding spread prevention wall 109a when forming the via hole V. Thereafter, the insulating layer 106 may be formed to cover the sidewalls and the bottom surface of the trench with a preset thickness. Then, because the bonding material flows along the engraved groove of the bonding spread prevention wall 109a, the bonding material may be prevented from spreading widely between the first electrode 108 and the second electrode 107. Other structures of the micro light emitting device 100a not described with reference to FIG. 8 may be the same as those of the micro light emitting device 100 shown in FIG. 1.

Figure 9:
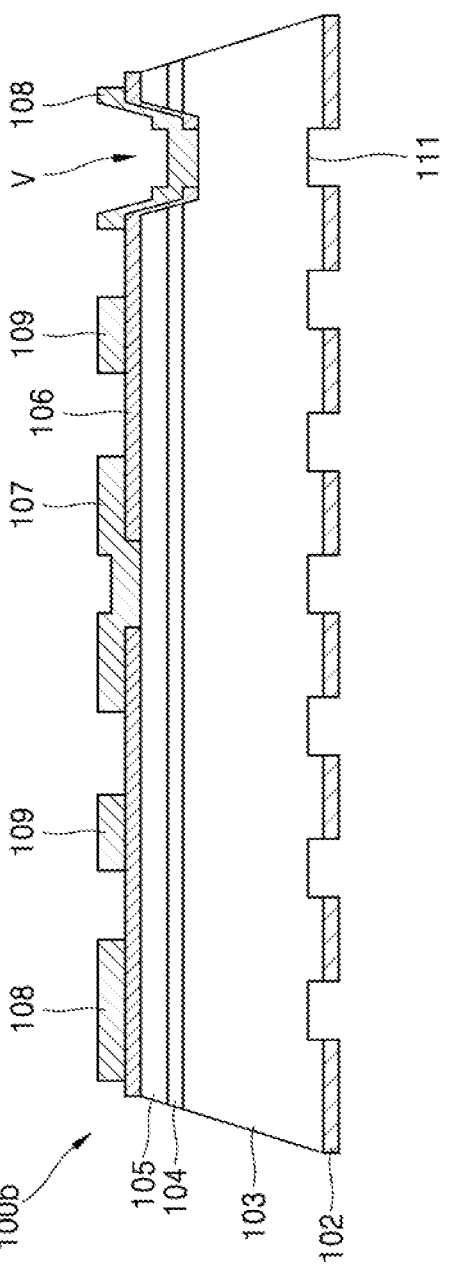
FIG. 9 is a cross-sectional view schematically illustrating a structure of a micro light emitting device according to an embodiment.

FIG. 9 is a cross-sectional view schematically illustrating a structure of a micro light emitting device according to an embodiment. Referring to FIG. 9, a micro light emitting device 100b may further include a plurality of grooves 111 formed in the lower surface of the AlN layer 102. The plurality of grooves 111 may be formed by etching the AlN layer 102. The plurality of grooves 111 may be formed by etching up to a portion of the first semiconductor layer 103. The plurality of grooves 111 may have a closed structure isolated from each other.

Figure 10A:
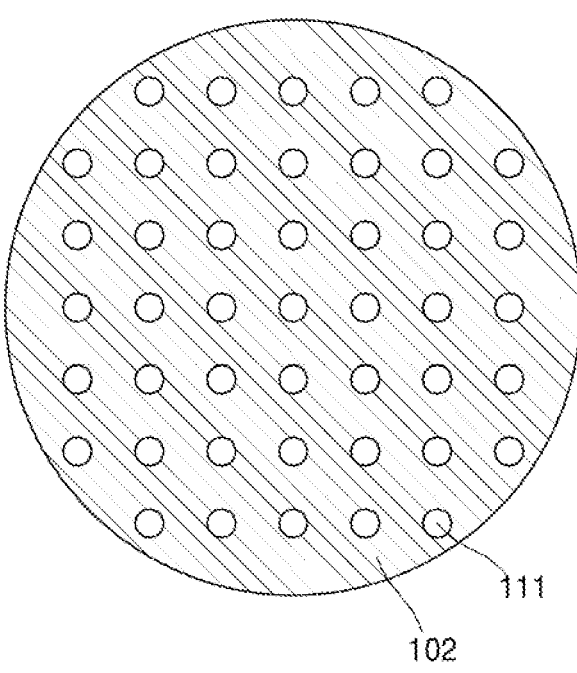
FIGS. 10A and 10B are plan views showing examples of a plurality of grooves formed in an aluminum nitride layer of the micro light emitting device shown in FIG. 9.
Figure 10B:
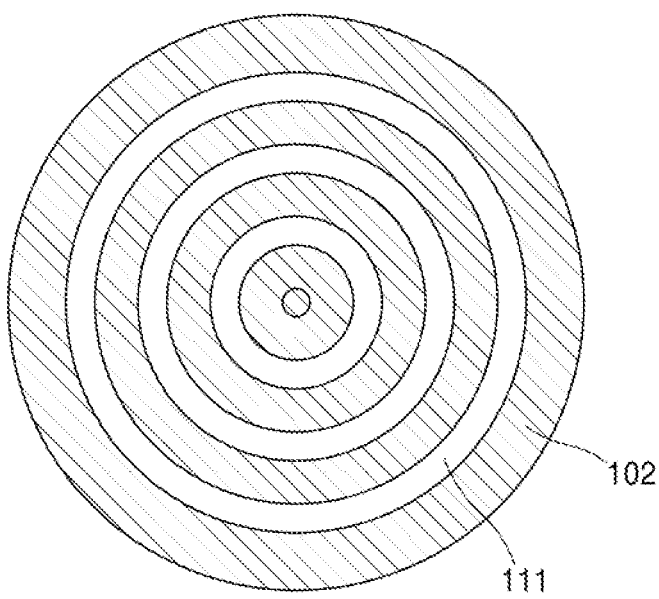

FIGS. 10A and 10B are plan views showing examples of a plurality of grooves 111 formed in the AlN layer 102 of the micro light emitting device 100b shown in FIG. 9. Referring to FIG. 10A, the plurality of grooves 111 may have a dot shape and may be two-dimensionally arranged in the lower surface of the AlN layer 102. In addition, referring to FIG. 10B, the plurality of grooves 111 may have a ring shape and may be arranged in a concentric circle shape in the lower surface of the AlN layer 102.

When aligning the micro light emitting device 100b on the transfer substrate 130 through the fluidic self assembly method described with reference to FIGS. 4 and 5, the plurality of grooves 111 may be filled with a liquid used for fluidic self assembly. The liquid filled in the plurality of grooves 111 may further increase the surface energy when the AlN layer 102 contacts the bottom surface 132 of the groove 135 of the transfer substrate 130. Accordingly, the micro light emitting device 100b may be more stably settled in the groove 135 of the transfer substrate 130. For this, the plurality of grooves 111 may have an isolated closed structure so that the liquid filled in the plurality of grooves 111 does not leak. For example, the plurality of grooves 111 may be arranged in the lower surface of the AlN layer 102 so that the liquid does not leak over the edge of the lower surface of the AlN layer 102.

In addition, the plurality of grooves 111 may serve as a light scattering structure that helps light generated from the light emitting layer 104 of the micro light emitting device 100b to pass through the AlN layer 102 to be emitted to the outside. Light generated from the light emitting layer 104 may be relatively uniformly emitted outside the AlN layer 102 while being refracted in the plurality of grooves 111. For this, the plurality of grooves 111 may be irregularly arranged.

Figure 11:
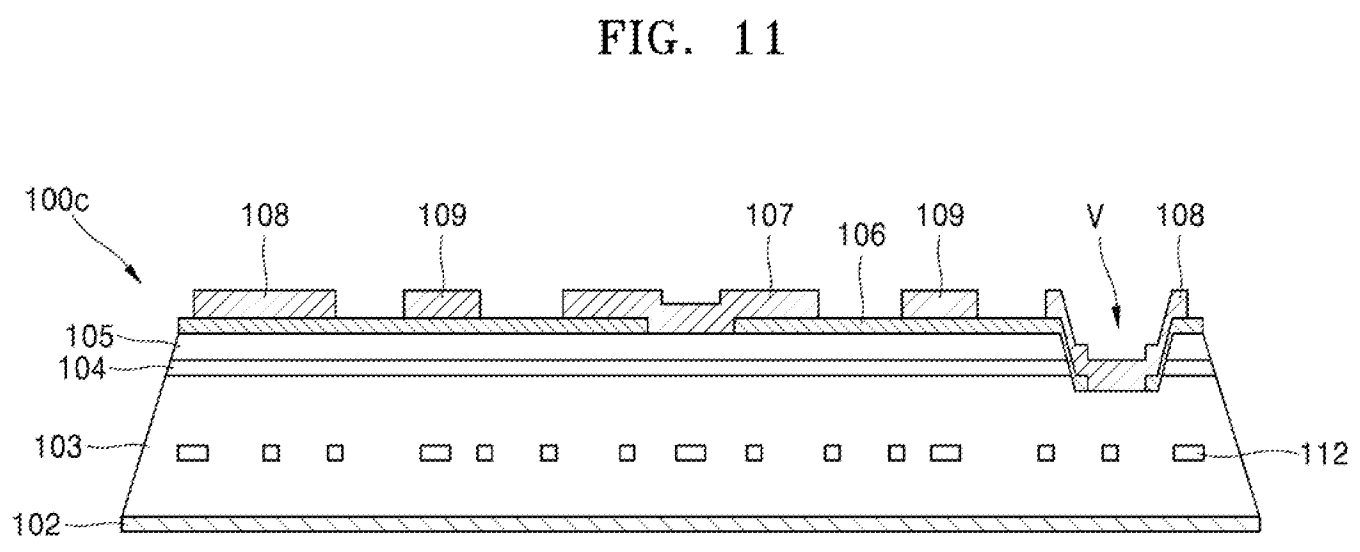

FIG. 11 is a cross-sectional view schematically illustrating a structure of a micro light emitting device according to an embodiment. Referring to FIG. 11, a micro light emitting device 100c may further include a light scattering structure 112 distributed in the first semiconductor layer 103. The light scattering structure 112 may be made of air, a void, a transparent dielectric material, or a semiconductor material different from that of the first semiconductor layer 103. The width, thickness, shape of the light scattering structure 112 or the distance between the light scattering structures 112 may be irregularly distributed. Accordingly, light generated from the light emitting layer 104 may be relatively uniformly emitted to the outside by the irregular light scattering structure 112 in the first semiconductor layer 103.

Figure 12:
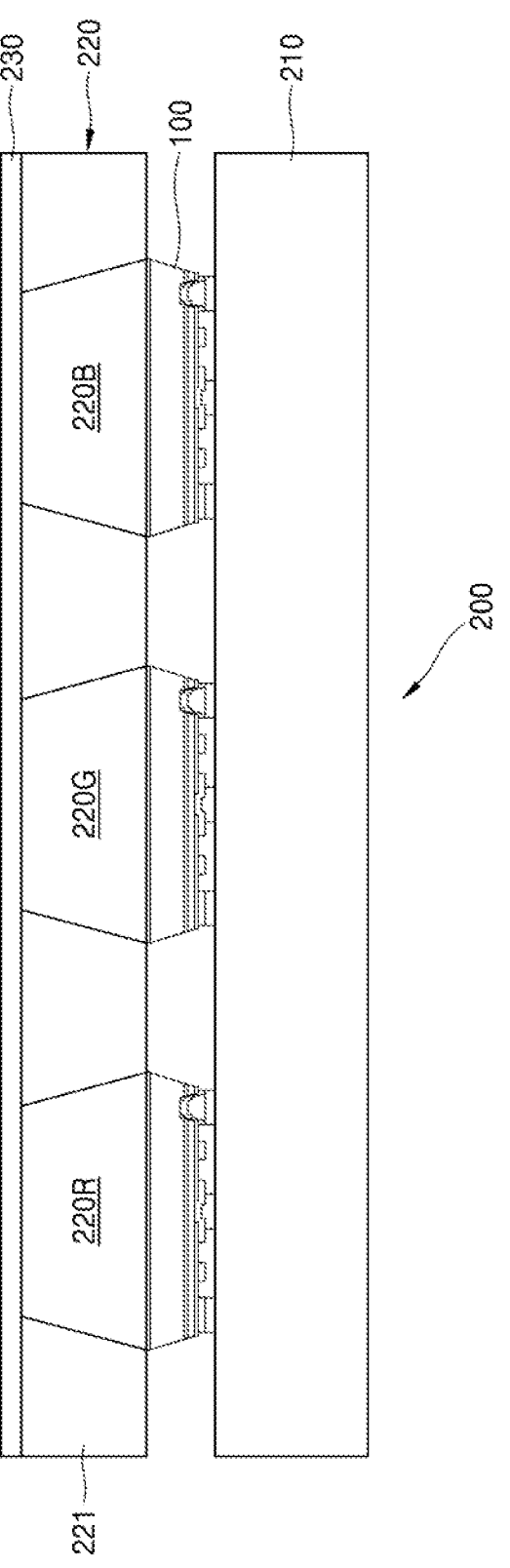
FIG. 12 is a cross-sectional view schematically illustrating a structure of a display apparatus according to an embodiment.

FIG. 12 is a cross-sectional view schematically illustrating a structure of a display apparatus according to an example embodiment. Referring to FIG. 12, a display apparatus 200 may include a display substrate 210, a plurality of micro light emitting devices 100 mounted on the display substrate 210, and a wavelength conversion layer 220 arranged on the plurality of micro light emitting devices 100. In addition, the display apparatus 200 may further include an upper substrate 230 arranged on the wavelength conversion layer 220. FIG. 12 shows that the micro light emitting device 100 shown in FIG. 1 is used, but micro light emitting devices 100a, 100b, and 100c according to other embodiments may also be used.

The wavelength conversion layer 220 may include a first wavelength conversion layer 220R for converting light emitted from the micro light emitting device 100 into light of a first wavelength band, a second wavelength conversion layer 220G for converting the light emitted from the micro light emitting device 100 into light of a second wavelength band different from the first wavelength band, and a third wavelength conversion layer 220B for converting the light emitted from the micro light emitting device 100 into light of a third wavelength band different from the first and second wavelength bands. For example, the light of the first wavelength band may be red light, the light of the second wavelength band may be green light, and the light of the third wavelength band may be blue light. The first wavelength conversion layer 220R, the second wavelength conversion layer 220G, and the third wavelength conversion layer 220B are arranged spaced apart with a diaphragm 221 arranged therebetween, and may be arranged to face the corresponding micro light emitting devices 100, respectively.

When the micro light emitting device 100 emits blue light, the third wavelength conversion layer 220B may include a resin that transmits blue light. The second wavelength conversion layer 220G may convert blue light emitted from the micro light emitting device 100 to emit green light. The second wavelength conversion layer 220G may include quantum dots or phosphors that are excited by blue light to emit green light. The first wavelength conversion layer 220R may change blue light emitted from the micro light emitting device 100 into red light to be emitted. The first wavelength conversion layer 220R may include quantum dots or phosphors that are excited by blue light to emit red light.

The quantum dots included in the first wavelength conversion layer 220R or the second wavelength conversion layer 220G may have a core-shell structure having a core portion and a shell portion, or may have a particle structure without a shell. The core-shell structure may be a single-shell or multi-shell structure, such as a double-shell structure. The quantum dots may include a group II-VI series semiconductor, a group III-V series semiconductor, a group IV-VI series semiconductor, a group IV series semiconductor, and/or graphene quantum dots. The quantum dots may include, for example, Cd, Se, Zn, S and/or InP, and each quantum dot may have a diameter of several tens of nm or less, for example, a diameter of about 10 nm or less. The quantum dots included in the first wavelength conversion layer 220R and the second wavelength conversion layer 220G may have different sizes.

Figure 13:
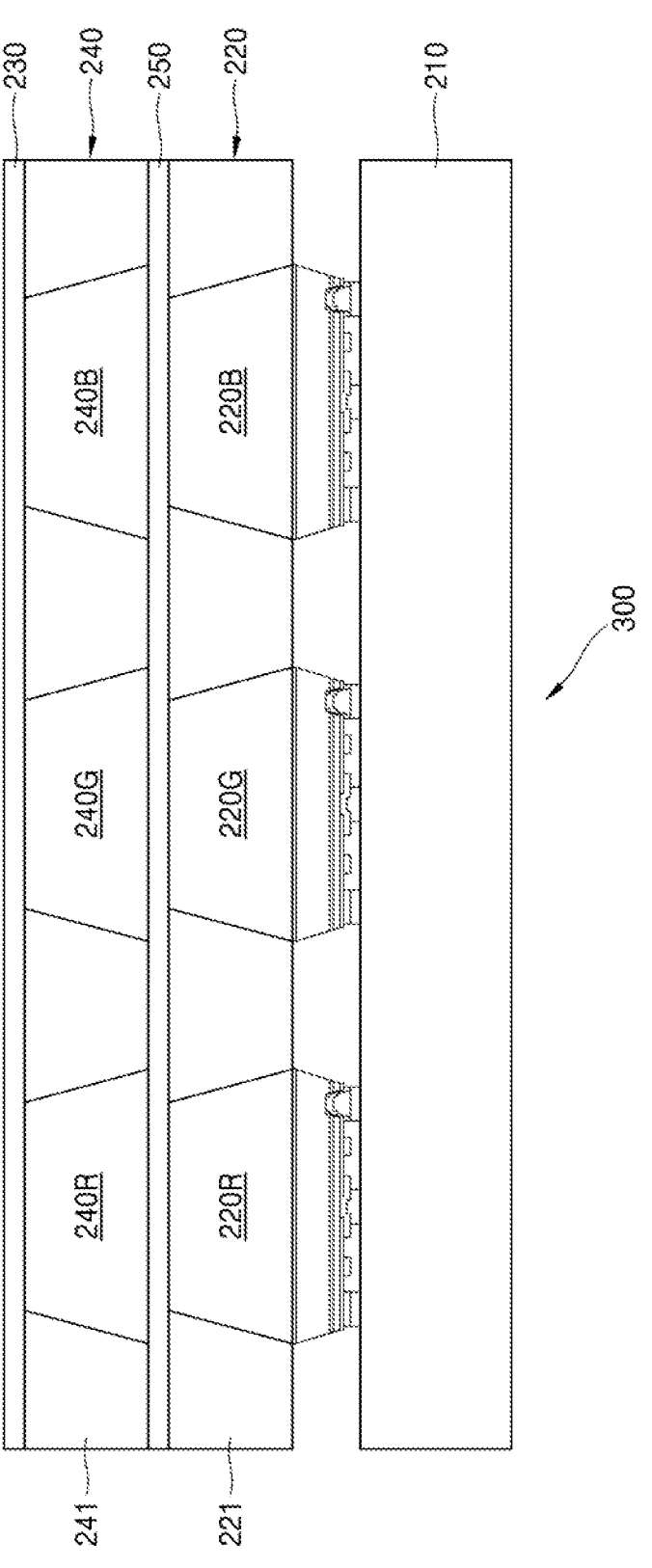
FIG. 13 is a cross-sectional view schematically illustrating a structure of a display apparatus according to an embodiment.

FIG. 13 is a cross-sectional view schematically illustrating a structure of a display apparatus according to an embodiment. Referring to FIG. 13, a display apparatus 300 may further include a capping layer 250 arranged on the wavelength conversion layer 220 and a color filter layer 240 arranged on the capping layer 250. The capping layer 250 and the color filter layer 240 may be arranged between the wavelength conversion layer 220 of the display apparatus 200 shown in FIG. 12 and the upper substrate 230. The color filter layer 240 includes a first filter 240R, a second filter 240G, and a third filter 240B spaced apart with a black matrix 241 therebetween. The first filter 240R, the second filter 240G, and the third filter 240B are arranged facing the first wavelength conversion layer 220R, the second wavelength conversion layer 220G, and the third wavelength conversion layer 220B, respectively. The first filter 240R, the second filter 240G, and the third filter 240B transmit red light, green light, and blue light, respectively, and absorb light of different colors. When the color filter layer 240 is provided, light other than red light emitted without wavelength conversion in the first wavelength conversion layer 220R, or light other than the green light emitted without wavelength conversion in the second wavelength conversion layer 220G may be removed by the first filter 240R and the second filter 240G, respectively, so that the color purity of the display apparatus 300 may be increased.

Figure 14:
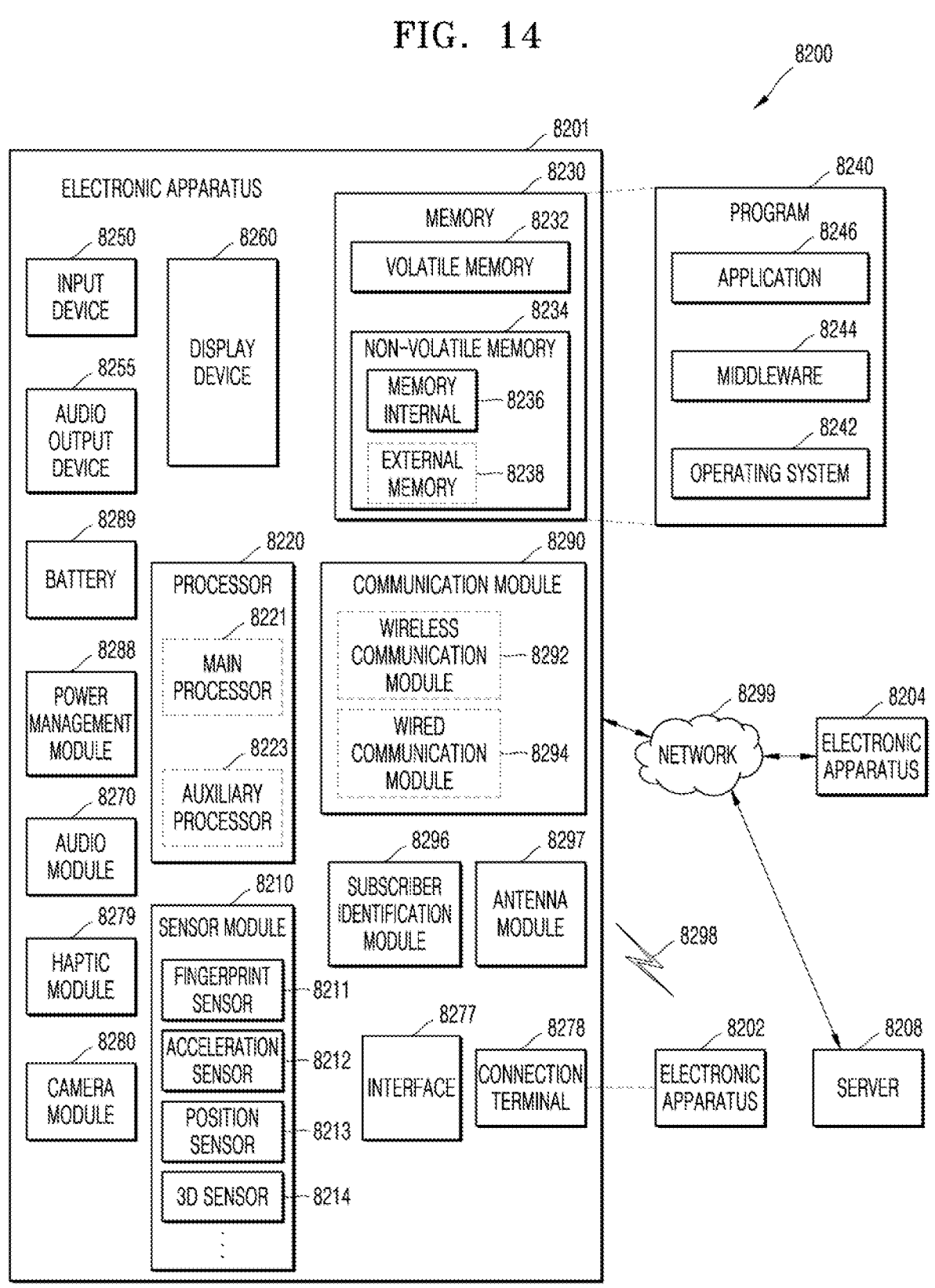
FIG. 14 is a schematic block diagram of an electronic device according to an embodiment.

The display apparatuses described above may be applied to various electronic devices having a screen display function. FIG. 14 is a schematic block diagram of an electronic device according to an example embodiment. Referring to FIG. 14, an electronic device 8201 may be provided in a network environment 8200. In the network environment 8200, the electronic device 8201 may communicate with another electronic device 8202 through a first network 8298 (such as a short-range wireless communication network and the like), or communicate with another electronic device 8204 and/or a server 8208 through a second network 8299 (such as a remote wireless communication network). The electronic device 8201 may communicate with the other electronic device 8204 through the server 8208. The electronic device 8201 may include a processor 8220, a memory 8230, an input device 8250, an audio output device 8255, a display apparatus 8260, an audio module 8270, a sensor module 8276, and an interface 8277, a haptic module 8279, a camera module 8280, a power management module 8288, a battery 8289, a communication module 8290, a subscriber identification module 8296, and/or an antenna module 8297. In the electronic device 8201, some of these components may be omitted or other components may be added. Some of these components may be implemented as one integrated circuit. For example, the sensor module 8276 (a fingerprint sensor, an iris sensor, an illuminance sensor, etc.) may be implemented by being embedded in the display apparatus 8260 (a display, etc.).

The processor 8220 may execute software (a program 8240, etc.) to control one or a plurality of other components (such as hardware, software components, etc.) of the electronic device 8201 connected to the processor 8220, and perform various data processing or operations. As part of data processing or operation, the processor 8220 may load commands and/or data received from other components (the sensor module 8276, the communication module 8290, etc.) into a volatile memory 8232, process commands and/or data stored in the volatile memory 8232, and store result data in a nonvolatile memory 8234. The nonvolatile memory 8234 may include an internal memory 8236 mounted in the electronic device 8201 and a removable external memory 8238. The processor 8220 may include a main processor 8221 (such as a central processing unit, an application processor, etc.) and a secondary processor 8223 (such as a graphics processing unit, an image signal processor, a sensor hub processor, a communication processor, etc.) that may be operated independently or together. The secondary processor 8223 may use less power than the main processor 8221 and may perform specialized functions.

The secondary processor 8223 may control functions and/or states related to some of the components of the other electronic device 8202 (such as the display apparatus 8260, the sensor module 8276, the communication module 8290, etc.) instead of the main processor 8221 while the main processor 8221 is in an inactive state (sleep state), or with the main processor 8221 while the main processor 8221 is in an active state (an application execution state). The secondary processor 8223 (such as an image signal processor, a communication processor, etc.) may be implemented as part of other functionally related components (such as the camera module 8280, the communication module 8290, etc.).

The memory 8230 may store various data required by components of the electronic device 8201 (such as the processor 8220, the sensor module 8276, etc.). The data may include, for example, software (such as the program 8240, etc.) and input data and/or output data for commands related thereto. The memory 8230 may include the volatile memory 8232 and/or the nonvolatile memory 8234.

The program 8240 may be stored as software in the memory 8230 and may include an operating system 8242, middleware 8244, and/or an application 8246.

The input device 8250 may receive commands and/or data to be used for components (such as the processor 8220, etc.) of the electronic device 8201 from outside (a user) of the electronic device 8201. The input device 8250 may include a remote controller, a microphone, a mouse, a keyboard, and/or a digital pen (such as a stylus pen).

The audio output device 8255 may output an audio signal to the outside of the electronic device 8201. The audio output device 8255 may include a speaker and/or a receiver. The speaker may be used for general purposes such as multimedia playback or recording playback, and the receiver may be used to receive incoming calls. The receiver may be combined as a part of the speaker or may be implemented as an independent separate device.

The display apparatus 8260 may visually provide information to the outside of the electronic device 8201. The display apparatus 8260 may include a display, a hologram device, or a projector and a control circuit for controlling the device. The display apparatus 8260 may include the above-described driving circuit, micro light emitting device, side reflection structure, bottom reflection structure, and the like. The display apparatus 8260 may include a touch circuit set to sense a touch, and/or a sensor circuit (such as a pressure sensor) set to measure the strength of a force generated by the touch.

The audio module 8270 may convert sound into an electrical signal, or conversely, may convert an electrical signal into sound. The audio module 8270 may acquire sound through the input device 8250 or output sound through speakers and/or headphones of the audio output device 8255, and/or other electronic devices (such as the other electronic device 8202) directly or wirelessly connected to the electronic device 8201.

The sensor module 8276 may detect an operating state (such as power, temperature, and the like) of the electronic device 8201 or an external environmental state (such as a user state and the like), and generate an electrical signal and/or data value corresponding to the detected state. The sensor module 8276 may include a gesture sensor, a gyro sensor, a barometric pressure sensor, a magnetic sensor, an acceleration sensor, a grip sensor, a proximity sensor, a color sensor, an infrared (IR) sensor, a biometric sensor, a temperature sensor, a humidity sensor, and/or an illuminance sensor.

The interface 8277 may support one or more specified protocols that may be used for the electronic device 8201 to connect directly or wirelessly with another electronic device (such as the other electronic device 8202). The interface 8277 may include a High Definition Multimedia Interface (HDMI), a Universal Serial Bus (USB) interface, an SD card interface, and/or an audio interface.

A connection terminal 8278 may include a connector through which the electronic device 8201 may be physically connected to another electronic device (such as the other electronic device 8202). The connection terminal 8278 may include an HDMI connector, a USB connector, an SD card connector, and/or an audio connector (such as a headphone connector).

The haptic module 8279 may convert an electrical signal into a mechanical stimulus (such as vibration, movement, etc.) or an electrical stimulus that a user may perceive through a tactile or motor sense. The haptic module 8279 may include a motor, a piezoelectric element, and/or an electrical stimulation device.

The camera module 8280 may capture a still image and a video. The camera module 8280 may include a lens assembly including one or more lenses, image sensors, image signal processors, and/or flashes. The lens assembly included in the camera module 8280 may collect light emitted from a subject that is a target of image capturing.

The power management module 8288 may manage power supplied to the electronic device 8201. The power management module 8288 may be implemented as a part of a Power Management Integrated Circuit (PMIC).

The battery 8289 may supply power to components of the electronic device 8201. The battery 8289 may include a non-rechargeable primary cell, a rechargeable secondary cell, and/or a fuel cell.

The communication module 8290 may support establishing a direct (wired) communication channel and/or a wireless communication channel, and performing communication through the established communication channel between the electronic device 8201 and other electronic devices (such as the other electronic device 8202, the other electronic device 8204, the server 8208, and the like). The communication module 8290 may include one or more communication processors that operate independently of the processor 8220 (such as an application processor) and support direct communication and/or wireless communication. The communication module 8290 may include a wireless communication module 8292 (such as a cellular communication module, a short-range wireless communication module, a Global Navigation Satellite System (GNSS) communication module, and the like) and/or a wired communication module 8294 (such as a local area network (LAN) communication module, a power line communication module, and the like). Among these communication modules, a corresponding communication module may communicate with other electronic devices through the first network 8298 (a short-range communication network such as Bluetooth, WiFi Direct, or Infrared Data Association (IrDA)) or the second network 8299 (a cellular network, the Internet, or a telecommunication network such as a computer network (such as LAN, WAN, and the like)). These various types of communication modules may be integrated into one component (such as a single chip and the like), or may be implemented as a plurality of separate components (a plurality of chips). The wireless communication module 8292 may check and authenticate the electronic device 8201 in a communication network such as the first network 8298 and/or the second network 8299 using subscriber information (such as an international mobile subscriber identifier (IMSI), etc.) stored in the subscriber identification module 8296.

The antenna module 8297 may transmit signals and/or power to the outside (such as other electronic devices) or receive signals and/or power from the outside. The antenna may include a radiator made of a conductive pattern formed on a substrate (such as a printed circuit board (PCB), etc.). The antenna module 8297 may include one or a plurality of antennas. If antennas are included, an antenna suitable for a communication method used in a communication network such as the first network 8298 and/or the second network 8299 may be selected from the plurality of antennas by the communication module 8290. Signals and/or power may be transmitted or received between the communication module 8290 and another electronic device through the selected antenna. In addition to the antenna, other components (such as a radio-frequency integrated circuit (RFIC) may be included as part of the antenna module 8297.

Some of the components are connected to each other and may exchange signals (such as commands, data, and the like) through a communication method between peripheral devices (such as a bus, a General Purpose Input and Output (GPIO), a Serial Peripheral Interface (SPI), a Mobile Industry Processor Interface (MIPI), and the like).

The command or data may be transmitted or received between the electronic device 8201 and the other electronic device 8204 through the server 8208 connected to the second network 8299. The other electronic devices 8202 and 8204 may be the same or different types of devices as or from the electronic device 8201. All or some of the operations executed by the electronic device 8201 may be executed by one or more of the other electronic devices, that is, the other electronic devices 8202 and 8204 and the server 8208. For example, when the electronic device 8201 needs to perform a certain function or service, instead of executing the function or service itself, the electronic device 8201 may request one or more other electronic devices to perform the function or part or all of the service. One or more other electronic devices that receive the request may execute an additional function or service related to the request, and transmit a result of the execution to the electronic device 8201. For this, cloud computing, distributed computing, and/or client-server computing technology may be used.

Figure 15:
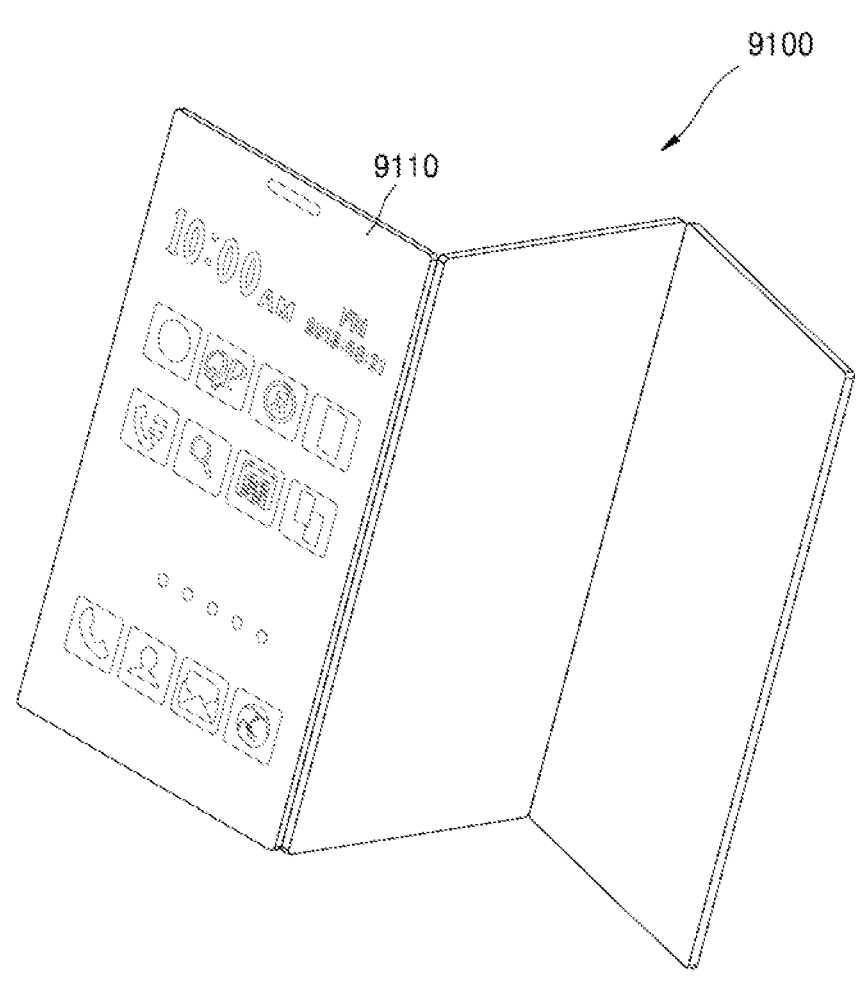
FIG. 15 illustrates an example in which a display apparatus according to embodiments is applied to a mobile device.

FIG. 15 illustrates an example in which a display apparatus according to embodiments is applied to a mobile device. A mobile device 9100 may include a display apparatus 9110, and the display apparatus 9110 may include the above-described driving circuit, micro light emitting device, side reflection structure, bottom reflection structure, and the like. The display apparatus 9110 may have a foldable structure, for example, a multi-foldable structure.

Figure 16:
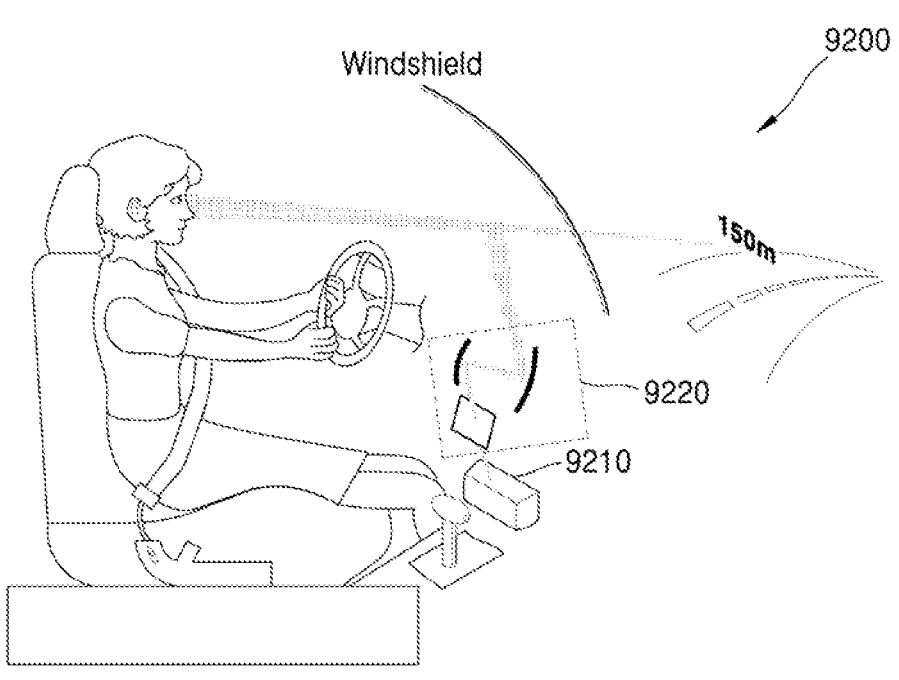
FIG. 16 illustrates an example in which the display apparatus according to embodiments is applied to a vehicle display apparatus.

FIG. 16 illustrates an example in which the display apparatus according to the embodiments is applied to a vehicle display apparatus. The display apparatus may be a vehicle head-up display apparatus 9200, and may include a display 9210 provided in an area of the vehicle, and a light path changing member 9220 that converts an optical path so that the driver may see the image generated on the display 9210.

Figure 17:
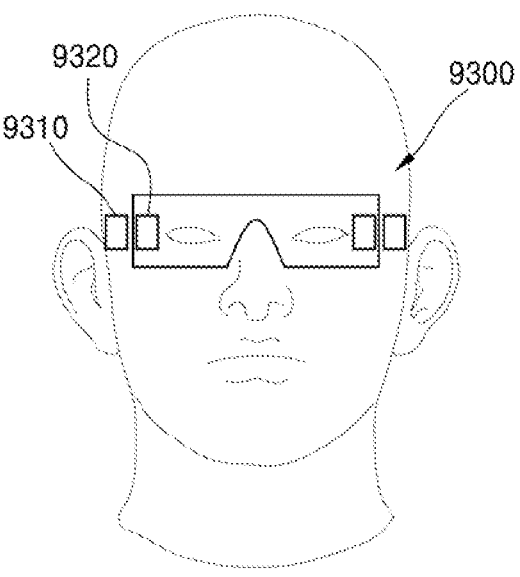
FIG. 17 illustrates an example in which the display apparatus according to embodiments is applied to augmented reality glasses or virtual reality glasses.

FIG. 17 illustrates an example in which a display apparatus according to embodiments is applied to augmented reality glasses or virtual reality glasses. Augmented reality glasses 9300 may include a projection system 9310 that forms an image, and an element 9320 that guides the image from the projection system 9310 into the user's eye. The projection system 9310 may include the above-described driving circuit, micro light emitting device, side reflection structure, bottom reflection structure, and the like.

Figure 18:
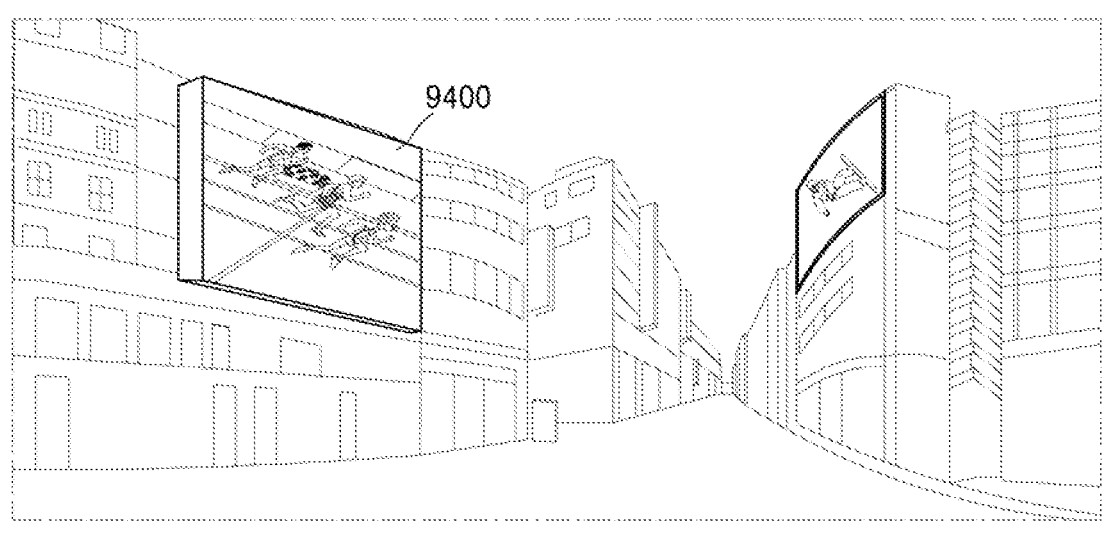
FIG. 18 illustrates an example in which the display apparatus according to embodiments is applied to a signage.

FIG. 18 illustrates an example in which a display apparatus according to embodiments is applied to a signage. A signage 9400 may be used for outdoor advertisement using a digital information display, and may control advertisement content and the like through a communication network. The signage 9400 may be implemented, for example, through the electronic device described with reference to FIG. 14.

Figure 19:
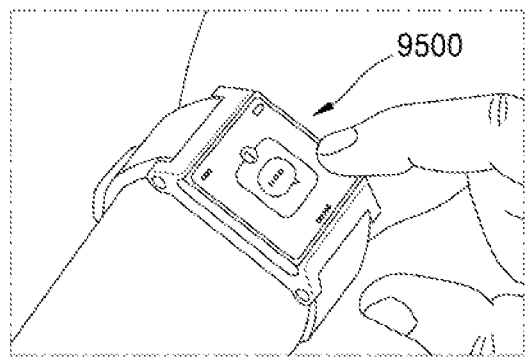
FIG. 19 illustrates an example in which the display apparatus according to embodiments is applied to a wearable display.

FIG. 19 illustrates an example in which a display apparatus according to embodiments is applied to a wearable display. A wearable display 9500 may include the above-described driving circuit, micro light emitting device, side reflection structure, bottom reflection structure, and the like, and may be implemented through the electronic device described with reference to FIG. 14.

The display apparatus according to example embodiments may also be applied to various products such as a rollable TV and a stretchable display.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A micro light emitting device comprising:
a first semiconductor layer doped with a first impurity having a first conductivity;
a light emitting layer arranged on an upper surface of the first semiconductor layer;
a second semiconductor layer arranged on an upper surface of the light emitting layer, the second semiconductor layer being doped with a second impurity having a second conductivity electrically opposite to the first conductivity;
an insulating layer arranged on an upper surface of the second semiconductor layer;
a first electrode arranged on an upper surface of the insulating layer and electrically connected to the first semiconductor layer;
a second electrode arranged on the upper surface of the insulating layer and electrically connected to the second semiconductor layer; and
an aluminum nitride layer arranged on a lower surface of the first semiconductor layer, the aluminum nitride layer comprising a flat surface,
wherein a surface roughness of a surface of the aluminum nitride layer is about 50 nm or less,
wherein a width of the first semiconductor layer is greater than a thickness of the micro light emitting device.

2. The micro light emitting device of claim 1, wherein a width of the micro light emitting device is in a range of about 1 μm to about 100 μm.

3. The micro light emitting device of claim 1, wherein the thickness of the micro light emitting device is in a range of about 2 μm to about 10 μm, and the width of the first semiconductor layer is in a range of about 5 μm to about 50 μm.

4. The micro light emitting device of claim 1, wherein a width of the second semiconductor layer is greater than the thickness of the micro light emitting device.

5. The micro light emitting device of claim 4, wherein a side surface of the micro light emitting device is inclined such that the width of the first semiconductor layer is greater than the width of the second semiconductor layer.

6. The micro light emitting device of claim 1, wherein the surface roughness of the surface of the aluminum nitride layer is about 10 nm or less.

7. The micro light emitting device of claim 1, further comprising an irregular light scattering structure distributed inside the first semiconductor layer.

8. The micro light emitting device of claim 1, wherein the aluminum nitride layer comprises a plurality of isolated grooves.

9. The micro light emitting device of claim 8, wherein each of the plurality of isolated grooves has a dot shape, and
wherein the plurality of isolated grooves is two-dimensionally arranged in a surface of the aluminum nitride layer.

10. The micro light emitting device of claim 8, wherein each the plurality of isolated grooves has a ring shape, and
wherein the plurality of isolated grooves is arranged concentrically in a surface of the aluminum nitride layer.

11. The micro light emitting device of claim 1, wherein the second electrode is arranged at a position corresponding to a center of the second semiconductor layer in a horizontal direction, and
wherein the first electrode is arranged at a position corresponding to an edge of the second semiconductor layer in the horizontal direction.

12. The micro light emitting device of claim 11, wherein the first electrode has a symmetrical shape surrounding the second electrode.

13. The micro light emitting device of claim 11, further comprising a via hole passing through the second semiconductor layer and the light emitting layer,
wherein the insulating layer extends to surround a sidewall of the via hole, and the first electrode is configured to contact the first semiconductor layer through the via hole, and
wherein the second electrode is configured to penetrate the insulating layer and contact the second semiconductor layer.

14. The micro light emitting device of claim 11, further comprising a bonding spread prevention wall arranged between the first electrode and the second electrode.

15. The micro light emitting device of claim 14, wherein the bonding spread prevention wall has a protruding shape on the upper surface of the insulating layer.

16. The micro light emitting device of claim 14, wherein the bonding spread prevention wall has a shape of a groove.

17. The micro light emitting device of claim 11, wherein the micro light emitting device has a rectangular cross-section viewed in a vertical direction, and
wherein the first electrode is arranged in two vertex regions facing each other in a diagonal direction.

18. The micro light emitting device of claim 17, further comprising a bonding pad arranged in each of two other vertex regions different from the two vertex regions, the two other vertex regions facing each other in another diagonal direction different from the diagonal direction.

19. A micro light emitting device comprising:
a first electrode on a first surface of the micro light emitting device; and
an aluminum nitride layer on a second surface of the micro light emitting device opposite to the first surface,
wherein a surface roughness of the aluminum nitride layer is 50 nm or less on a surface of the aluminum nitride layer which is opposite to the micro light emitting device,
wherein a first shape of the first electrode is radially symmetrical with respect to a center of the micro light emitting device.

20. The micro light emitting device of claim 19, further comprising a second electrode on the first surface, wherein a second shape of the second electrode is radially symmetrical with respect to the center of the micro light emitting device.

21. A micro light emitting device comprising:

a first semiconductor layer doped with a first impurity having a first conductivity;

a light emitting layer arranged on an upper surface of the first semiconductor layer;

a second semiconductor layer arranged on an upper surface of the light emitting layer, the second semiconductor layer being doped with a second impurity having a second conductivity electrically opposite to the first conductivity;

an insulating layer arranged on an upper surface of the second semiconductor layer;

a first electrode arranged on an upper surface of the insulating layer and electrically connected to the first semiconductor layer;

a second electrode arranged on the upper surface of the insulating layer and electrically connected to the second semiconductor layer;

a bonding spread prevention wall arranged between the first electrode and the second electrode;

a bonding pad arranged on the upper surface of the insulating layer; and an aluminum nitride layer arranged on a lower surface of the first semiconductor layer, the aluminum nitride layer comprising a flat surface.

* * * * *